(12) United States Patent
Nitta et al.

(10) Patent No.: US 7,934,182 B2
(45) Date of Patent: Apr. 26, 2011

(54) METHOD AND APPARATUS FOR SUPPORTING DELAY ANALYSIS, AND COMPUTER PRODUCT

(75) Inventors: Izumi Nitta, Kawasaki (JP); Katsumi Homma, Kawasaki (JP); Toshiyuki Shibuya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 174 days.

(21) Appl. No.: 12/193,431

(22) Filed: Aug. 18, 2008

(65) Prior Publication Data

US 2009/0138838 A1 May 28, 2009

(30) Foreign Application Priority Data

Nov. 22, 2007 (JP) ................................. 2007-302775

(51) Int. Cl.
G06F 17/50 (2006.01)
(52) U.S. Cl. ....................................................... 716/100
(58) Field of Classification Search .................. 716/1, 6, 716/100
See application file for complete search history.

(56) References Cited

U.S. PATENT DOCUMENTS

| | | | | |
|---|---|---|---|---|
| 6,662,291 | B2 * | 12/2003 | Hashimoto et al. | 711/217 |
| 7,350,171 | B2 * | 3/2008 | Zhang et al. | 716/6 |
| 7,689,956 | B2 * | 3/2010 | Ikeda | 716/6 |
| 2006/0236279 | A1 | 10/2006 | Homma | |
| 2007/0113211 | A1 * | 5/2007 | Zhang et al. | 716/6 |
| 2008/0010558 | A1 * | 1/2008 | Ikeda | 714/47 |
| 2009/0306953 | A1 * | 12/2009 | Liu et al. | 703/14 |

FOREIGN PATENT DOCUMENTS

JP  A 2006-268479  10/2006

OTHER PUBLICATIONS

C. Visweswariah, et al., "First-Order Incremental Block-Based Statistical Timing Analysis," In Proc. of the Design Automation Conf., pp. 331-336, 2004.
Hongliang Chang, et al., "Statistical Timing Analysis Considering Spatial Correlations Using Single Pert-Like Traversal," In Proc. Intl. Conference on Computer Aided Design, pp. 621-625, 2003.
Ruiming Chen, et al., "New Block-Based Statistical Timing Analysis Approaches Without Moment Matching," In. Proc. of the 12th Asia and South Pacific Design Automation Conference, pp. 462-267, 2007.
Aseem Agarwal, et al., "Statistical Timing Analysis using Bounds," IEEE, In Proc. of Date, pp. 62-67, 2003.

* cited by examiner

*Primary Examiner* — Jack Chiang
*Assistant Examiner* — Suchin Parihar
(74) *Attorney, Agent, or Firm* — Fujitsu Patent Center

(57) ABSTRACT

A delay distribution of a partial path that passes through a node to which a plurality of signals is input and for which an estimation in a statistical MAX is predicted to be large, that is present on a critical path having large influence on a circuit delay, and that has high possibility of improving the circuit delay, among nodes in a circuit graph is calculated by the Monte Carlo simulation instead of the block based simulation, thereby increasing speed and accuracy of delay analysis.

12 Claims, 20 Drawing Sheets

SCANNING DIRECTION

FIG.7
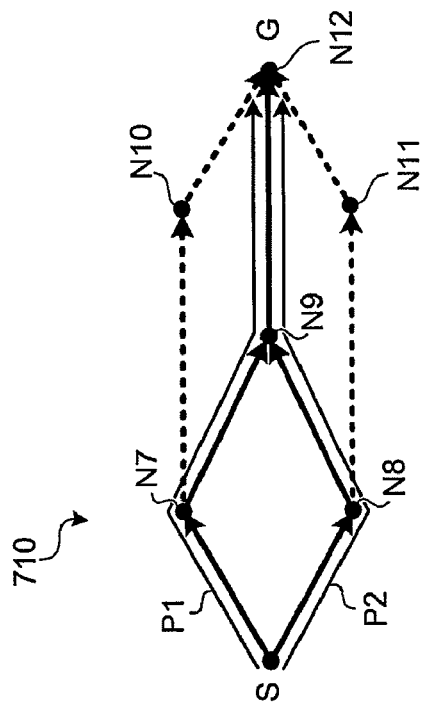
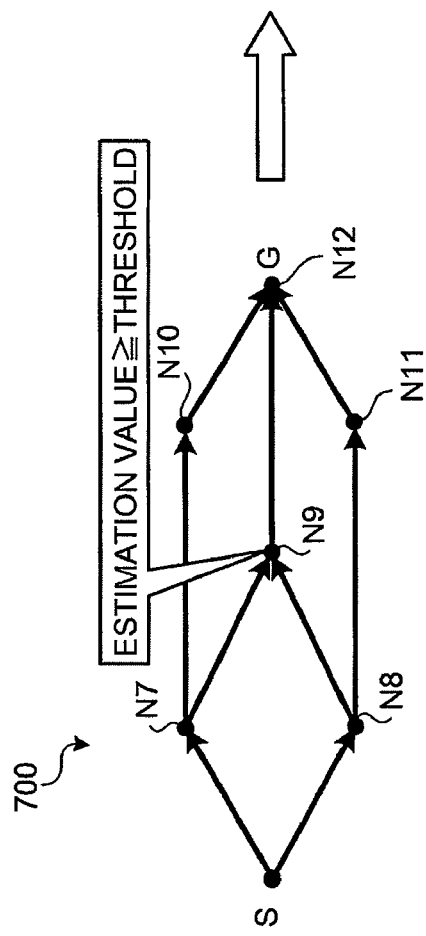

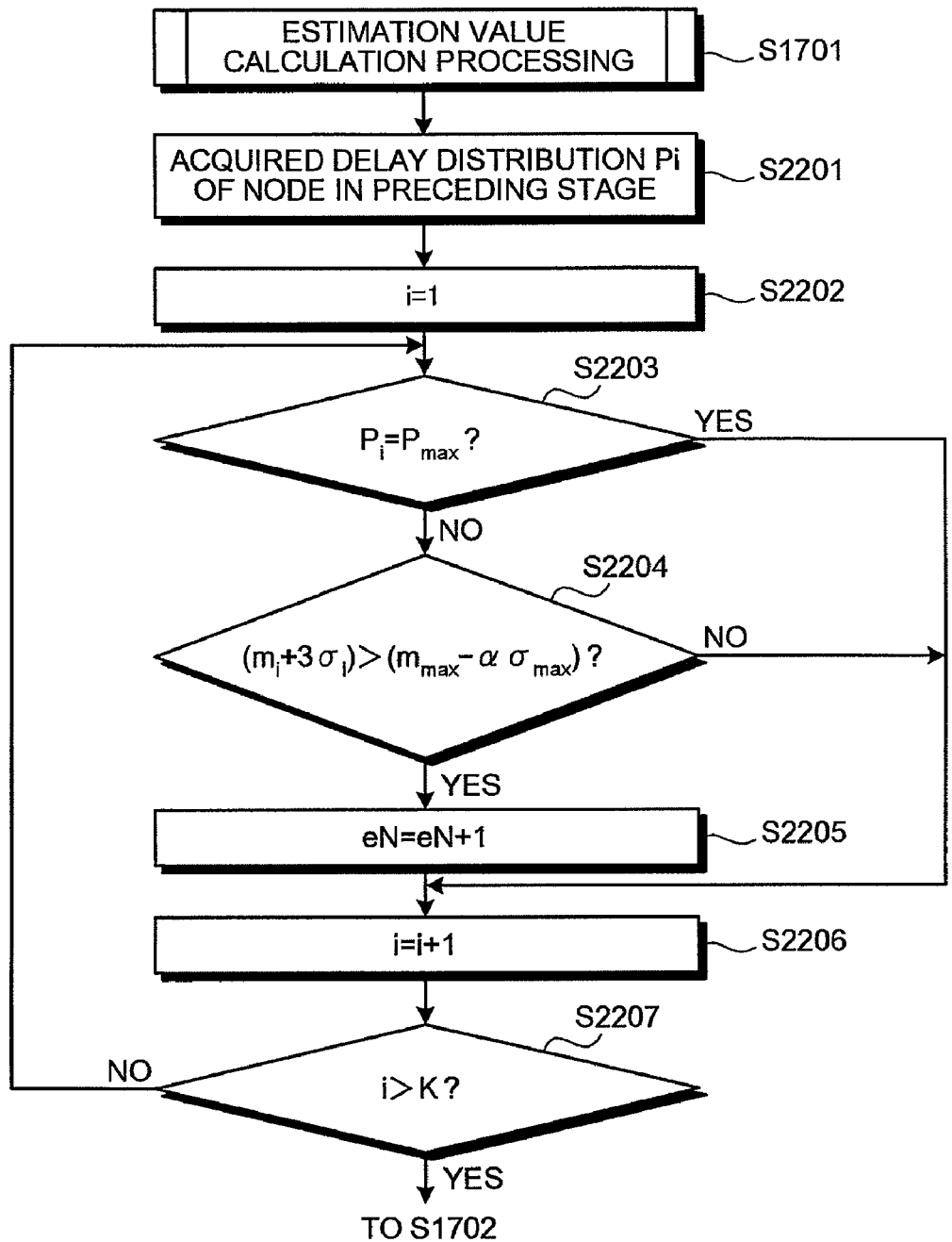

METHOD AND APPARATUS FOR SUPPORTING DELAY ANALYSIS, AND COMPUTER PRODUCT

CROSS-REFERENCE TO RELATED APPLICATIONS

This application is based upon and claims the benefit of priority from the prior Japanese Patent Application No. 2007-302775, filed on Nov. 22, 2007, the entire contents of which are incorporated herein by reference.

BACKGROUND OF THE INVENTION

1. Field of the Invention

The present invention relates to a technology of delay analysis support for circuits.

2. Description of the Related Art

With miniaturization of large-scale integrations (LSI) in recent years, influence of statistical factors, such as process variation, reduction of supply voltage, and crosstalk, has become large, and a variation in circuit delay has been increasing. In a conventional static timing analysis (STA), a delay margin is secured for such a variation in circuit delay. Because of increase of the delay margin, timing design has become difficult.

For this reason, a demand for statistical static timing analysis (SSTA) increases in which an unnecessary delay margin is reduced by estimating circuit delay considering the statistical factors. As a method of SSTA, there is a block-based analysis, for example. In the block-based analysis, a circuit graph is topologically scanned, and a delay distribution of each node in the circuit graph is statistically acquired. By this block-based analysis, the entire circuit can be analyzed speedily.

On the other hand, by the block-based analysis, it is considerably difficult to acquire a true delay distribution of a node at which multiple signals run together. Therefore, the delay distribution of the node is approximately estimated using a statistical MAX operation. However, an estimation error by the statistical MAX operation can become large. As a result, accuracy of the delay analysis is deteriorated.

A method of enhancing the estimation accuracy of the statistical MAX operation performed in the block-based analysis has been disclosed in, for example, Proc. of the Design Automation Conf., pages 331-336, 2004, titled "First-order incremental blockbased statistical timing analysis" by C. Visweswariah, et al.; Proc. Intl. Conf. on computer-Aided Design, pages 621-625, 2003, titled "Statistical timing analysis considering spatial correlations using a single pertlike traversal" by H. Chang, et al.; and Proc. of the 12th Asia and South Pacific Design Automation Conf., pages 462-467, 2007, titled "New Block-based Statistical Timing Analysis Approaches without Moment Matching" by H. Zhou, et al.

However, in the conventional technique described above, to accurately acquire the delay distribution of the node at which multiple signals run together, complicated calculation is required, and the high speed property of the block-based analysis can be set off thereby. As a result, time required for the delay analysis increases, leading to increased design period.

Monte Carlo simulation, which enables to estimate the circuit delay accurately, is applicable instead of the block-based analysis. However, it is assumed that calculation time and an amount of memory exponentially increase with the scale of a circuit. Accordingly, application to a large scale circuit is difficult.

SUMMARY OF THE INVENTION

It is an object of the present invention to at least solve the above problems in the conventional technology.

A computer-readable recording medium according to an aspect of the present invention stores therein a computer program for supporting delay analysis to estimate a delay distribution of a circuit graph of an analysis object by a block-based analysis. The computer program causes a computer to execute detecting, from the circuit graph, a node to which a plurality of signals is input; estimating an estimation value concerning an estimation error of a delay analysis of the node, based on a delay distribution of a node group in a preceding stage to the node detected at the detecting; determining whether the estimation value is equal to or larger than a threshold; and outputting a result of determination made at the determining.

A delay analysis supporting apparatus according to another aspect of the present invention supports delay analysis to estimate a delay distribution of a circuit graph of an analysis object by a block-based analysis. The delay analysis supporting apparatus includes a detecting unit that detects, from the circuit graph, a node to which a plurality of signals is input; an estimating unit that estimates an estimation value concerning an estimation error of a delay analysis of the node, based on a delay distribution of a node group in a preceding stage to the node detected by the detecting unit; a determining unit that determines whether the estimation value is equal to or larger than a threshold; and an output unit that outputs a result of determination made by the determining unit.

A delay analysis supporting method according to still another aspect of the present invention is for supporting delay analysis to estimate a delay distribution of a circuit graph of an analysis object by a block-based analysis. The delay analysis supporting method includes detecting, from the circuit graph, a node to which a plurality of signals is input; estimating an estimation value concerning an estimation error of a delay analysis of the node, based on a delay distribution of a node group in a preceding stage to the node detected at the detecting; determining whether the estimation value is equal to or larger than a threshold; and outputting a result of determination made at the determining.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 7 is a schematic diagram of a circuit of reanalysis object (I)

FIG. 22 is a flowchart of the estimation value calculation (II).

DETAILED DESCRIPTION OF THE PREFERRED EMBODIMENTS

Exemplary embodiments of the present invention are explained in detail below with reference to the accompanying drawings.

In a block-based analysis, delay distribution of each node in a circuit graph is calculated by topologically scanning the circuit graph of an analysis object. By the block-based analysis, the entire circuit can be analyzed speedily.

Figure 1:
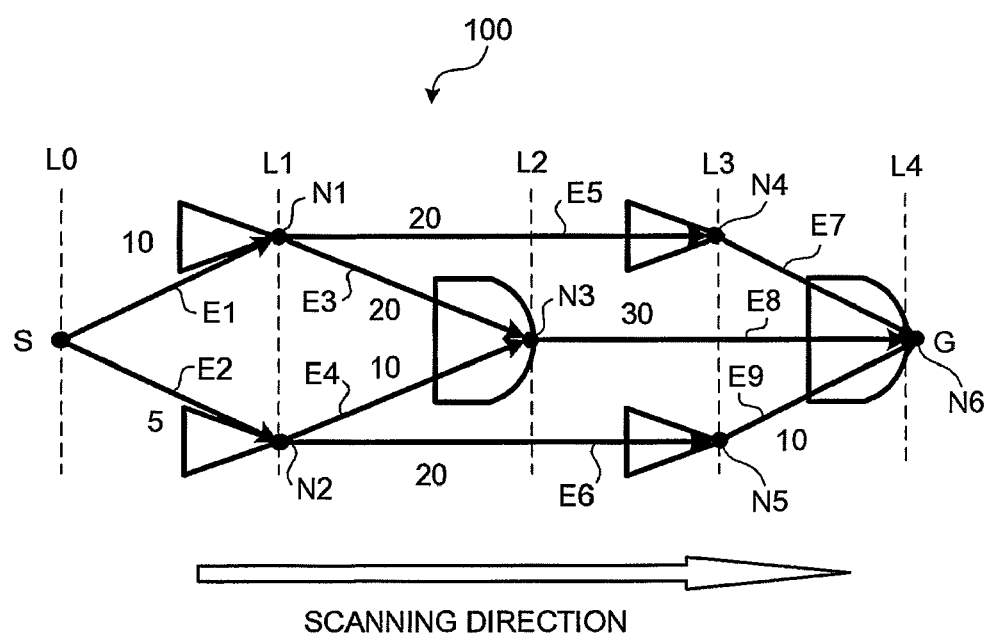
FIG. 1 is a schematic diagram of a circuit graph.

FIG. 1 is a schematic diagram of a circuit graph. As shown in FIG. 1, a circuit graph 100 is a digraph in which circuit devices (buffer, AND gate, etc.) that constitute the analysis object are expressed as nodes N1 to N6 in a graph. Levels S0 to L4 shown in FIG. 1 express distances from a starting point S to each of the nodes N1 to N6. An ending point G is an output pin of the node N6.

Numerals assigned to the respective edges E1 to E9 indicate transmission time (delay) of a signal between nodes. In this example, the delay between nodes is expressed not by probability density distribution but by a fixed value to explain the procedure of the block-based analysis. As an initial setting, a distribution start time (delay at the starting point S) of signals is set to "0".

To acquire delay of an entire circuit, time required for a signal to reach the ending point G from the starting point S in the circuit graph 100 is acquired by the block-based analysis. First, the delay of the nodes N1 and N2 at level L1 is acquired. The delay of the nodes N1 and N2 can be acquired, for example, by Equations 1 and 2.

delay of node N1=(delay at starting point S)+(delay at edge E1)=10  (1)

delay of node N2=(delay at starting point S)+(delay at edge E2)=5  (2)

The delay distribution of the node N3 at level L2 is then acquired. The delay of the node N3 can be acquired, for example, by Equation 3 below.

delay of node N3=max{(delay of node N1)+(delay at edge E3), (delay of node N2)+(delay at edge E4)}=max(30, 15)☐30  (3)

In the similar manner, the delay of the nodes N4 and N5 at level L3, and of the node N6 (ending point G) at level L4 are sequentially acquired. By thus acquiring the delay of each of the nodes N1 to N6 according to levels L0 to L4, time required for a signal to reach the ending point G from the starting point S in the circuit graph 100, that is, the delay of the entire circuit can be acquired.

While in the above example, the delay between nodes (edges E1 to E9) is expressed by a fixed value for explanation, in the present embodiment, the delay between nodes is expressed by probability density distribution to consider the statistical factors. Thus, the delay of each of the nodes N1 to N6 is statistically acquired using a statistical SUM, a statistical MAX, and the like.

The statistical SUM is an operation that is used when a signal is propagated in series, and is a method of estimating the delay distribution of an output pin of a single input gate such as a buffer and an inverter using a convolution integral, for example. The statistical MAX is an operation that is used when signals run together, and is a method of approximately acquiring the delay distribution of an output pin of a multiple input gate such as a NAND gate by calculating the maximum value of the delay of a plurality of signals, for example.

However, as described previously, in a node (for example, the node N3) at which multiple signals run together, an estimation error occurs by the statistical MAX. Particularly, because of the property of the statistical MAX, if input delay distributions are comparable with each other, the estimation error by the statistical MAX increases.

Figure 2:
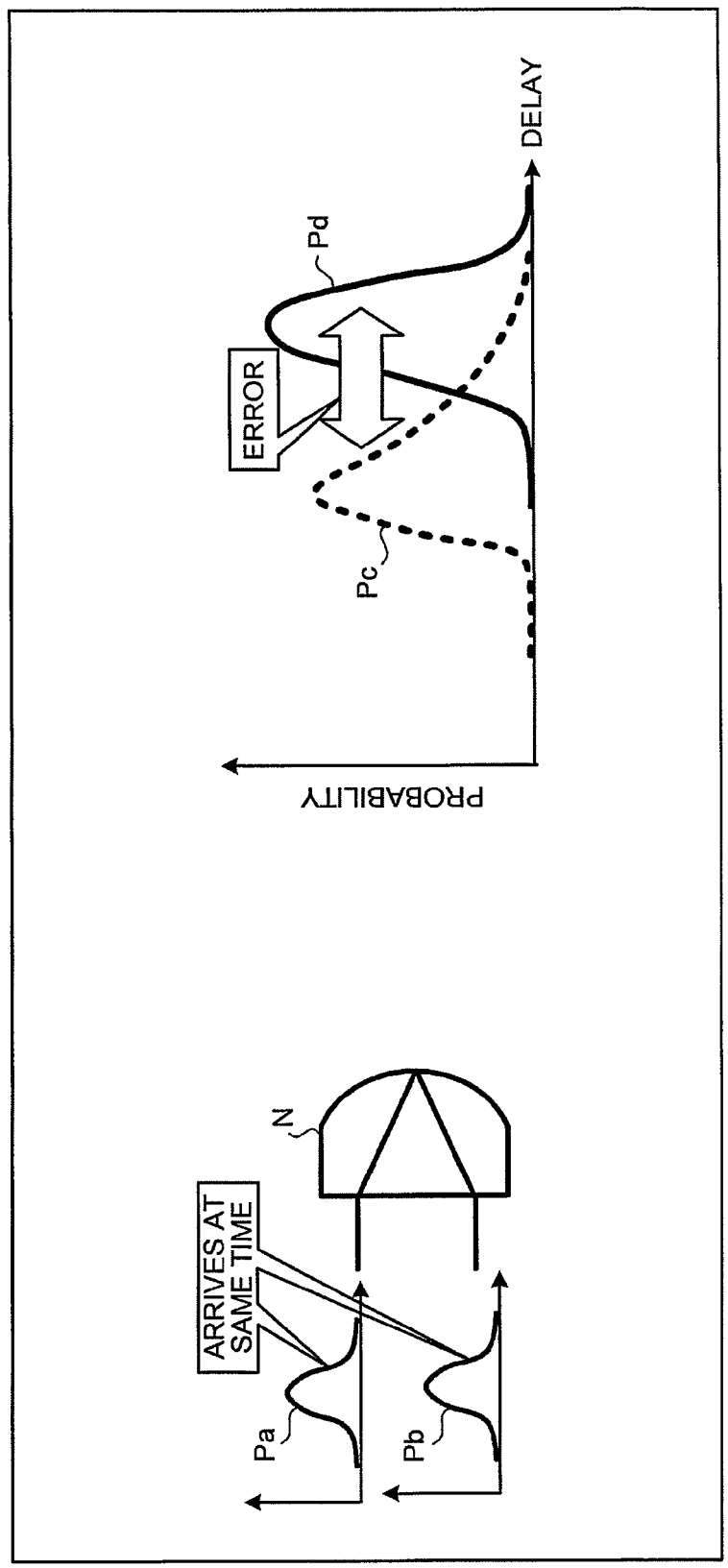
FIG. 2 illustrates conventional problems.

FIG. 2 illustrates conventional problems. As shown in FIG. 2, when the delay distributions Pa and Pb of signals input to a node N (AND gate) are comparable with each other, the estimation error of a delay distribution Pd of the node N that is acquired by the statistical MAX with respect to a true delay distribution Pc of the node N. When the estimation error increases, the accuracy of the delay analysis is deteriorated.

In the present embodiment, the delay distribution of a partial circuit constituted of a path that passes through a node for which the estimation error when the delay distribution of the node at which multiple signals run together is estimated to be large is acquired by the Monte Carlo simulation instead of the block-based analysis, thereby achieving highly accurate delay analysis.

The delay of a critical path has larger influence on the delay of the entire circuit compared to the delay of a path that is not critical, and tends to be predominant with respect to a mean value of the delay distribution of the circuit. Therefore, the accuracy in estimation of the delay of a critical path affects the accuracy of the delay analysis.

Figure 3:
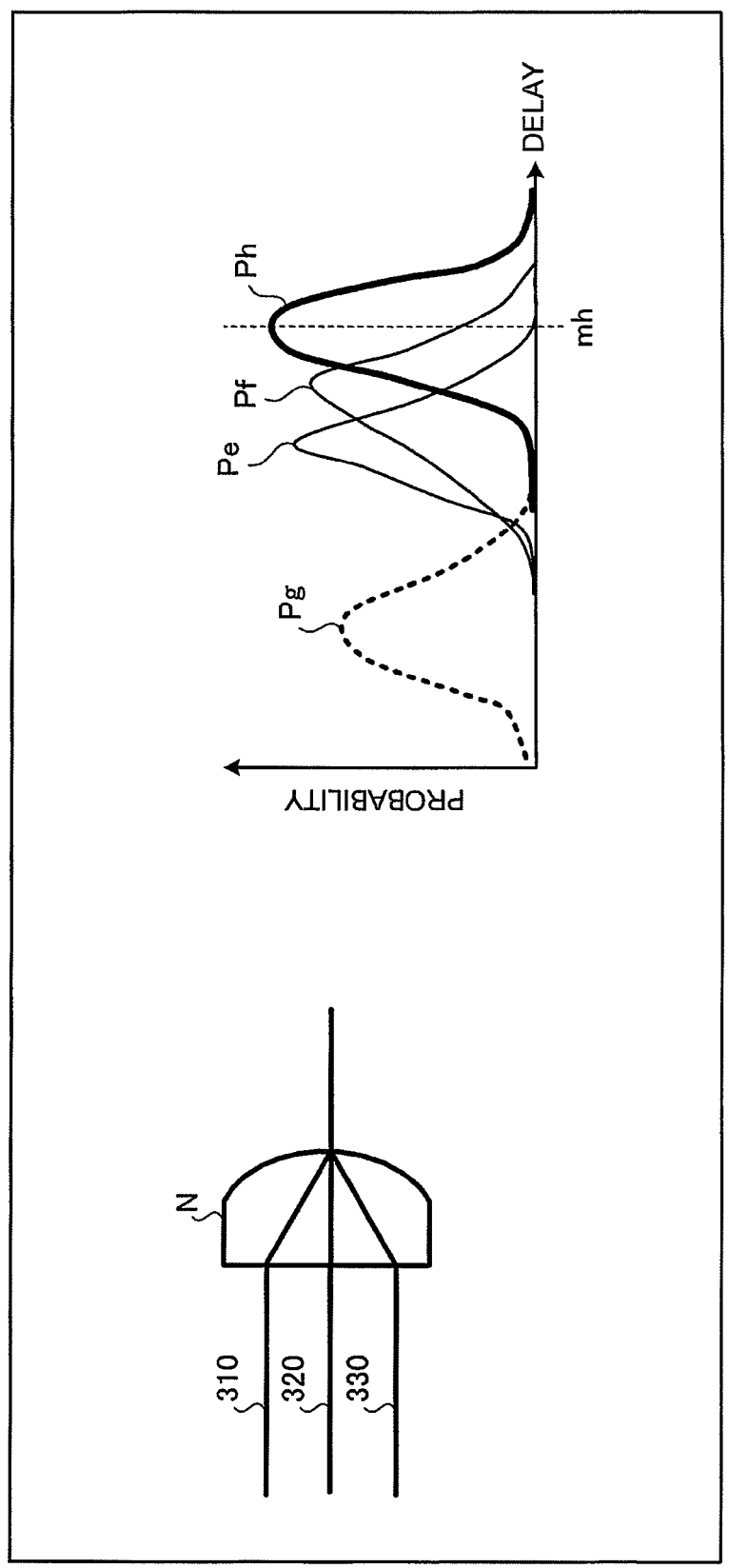
FIG. 3 illustrates a delay distribution of a path.

FIG. 3 illustrates the delay distribution of a path. The node N is expressed by an AND gate that is included in critical paths 310 and 320, and a not critical path 330. Delay distributions Pe and Pf are the delay distributions of the critical paths 310 and 320. A delay distribution Pg is the delay distribution of the path 330. A delay distribution Ph is the delay distribution of the entire circuit.

As shown in FIG. 3, the delay distributions Pe and Pf have larger influence on the delay distribution Ph compared to the delay distribution Pg, and is predominant to a mean value mh of the delay distribution Ph.

Therefore, in the present embodiment, when it is assumed that the estimation error is large in the approximate calculation of the delay distribution of a node at which multiple signals run together and the node is present on a critical path, the delay distribution of a partial circuit that is constituted of a pass passing through the node is acquired by the Monte Carlo simulation instead of the block-based analysis, thereby enhancing the accuracy of the delay analysis.

Figure 4:
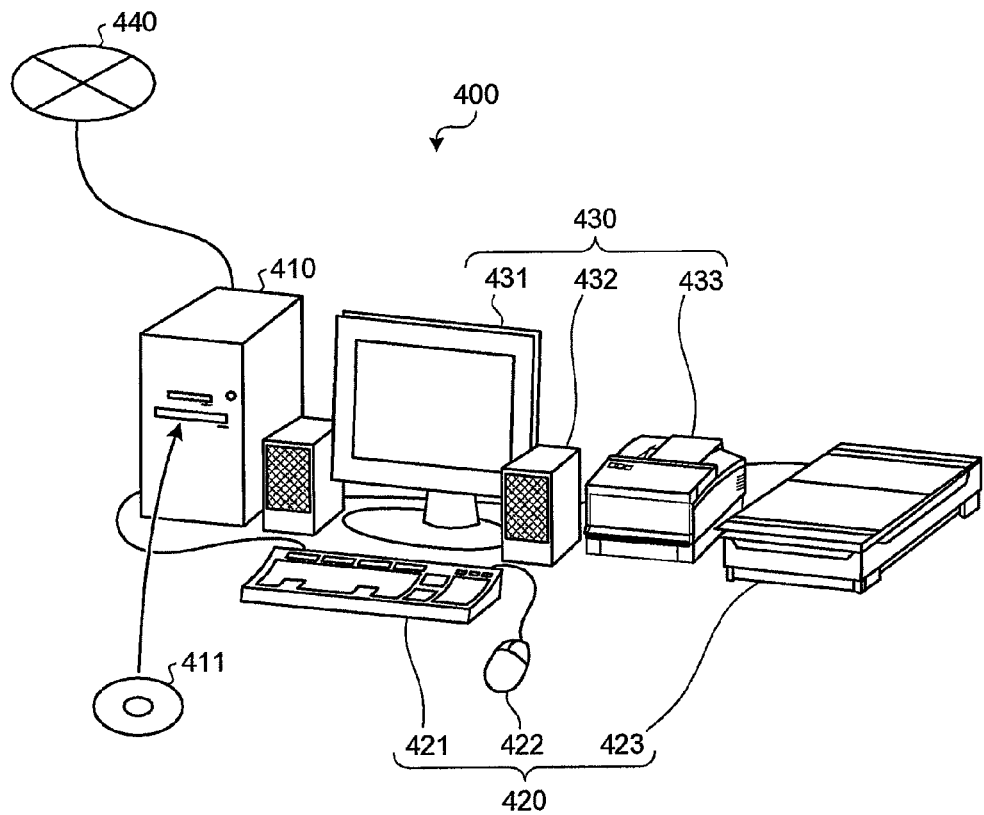
FIG. 4 is a schematic diagram showing a hardware configuration of a delay analysis supporting apparatus according to an embodiment of the present invention.

FIG. 4 is a schematic of a hardware configuration of a delay analysis supporting apparatus according to an embodiment. As shown in FIG. 4, a delay analysis supporting apparatus 400 includes a computer 410, an input device 420, and an output device 430 and is connectable to a network 440 such as a local area network (LAN), wide area network (WAN), or the Internet via a router or a modem (not shown).

The computer 410 includes a central processing unit (CPU), a memory, and an interface. The CPU controls the entire delay analysis supporting apparatus 400. The memory includes a read-only memory (ROM), a random access memory (RAM), a hard drive (HD), an optical disk 411, and a flash memory. The memory is used as a work area of the CPU.

The memory stores various programs, which are loaded according to an instruction from the CPU. The reading/writing of data from and to the HD and the optical disk 411 are controlled by a disk drive. Further, the optical disk 411 and the flash memory are detachable from the computer 410. The interface controls input from input device 420, output to the output device 430, and transmission/reception to and from the network 440.

Further, the input device 420 includes a keyboard 421, a mouse 422, and a scanner 423. The keyboard 421 includes keys to input text, numerals, and various instructions. Further, the input device 420 can be a touch panel type device. The mouse 422 moves a cursor, determines an area, moves a window, or changes the dimensions for the window. The scanner 423 optically scans an image. The scanned image is imported as image data and stored in the memory of the computer 410. The scanner 423 can have an optical character recognition (OCR) function.

Further, the output device 430 includes a display 431, a speaker 432, and a printer 433. The display 431 displays a cursor, icons, toolboxes, and data such as documents, images, and function information. The speaker 432 outputs sound such as a sound effect, a read-out voice, and the like. The printer 433 prints image date and document data.

Figure 5:
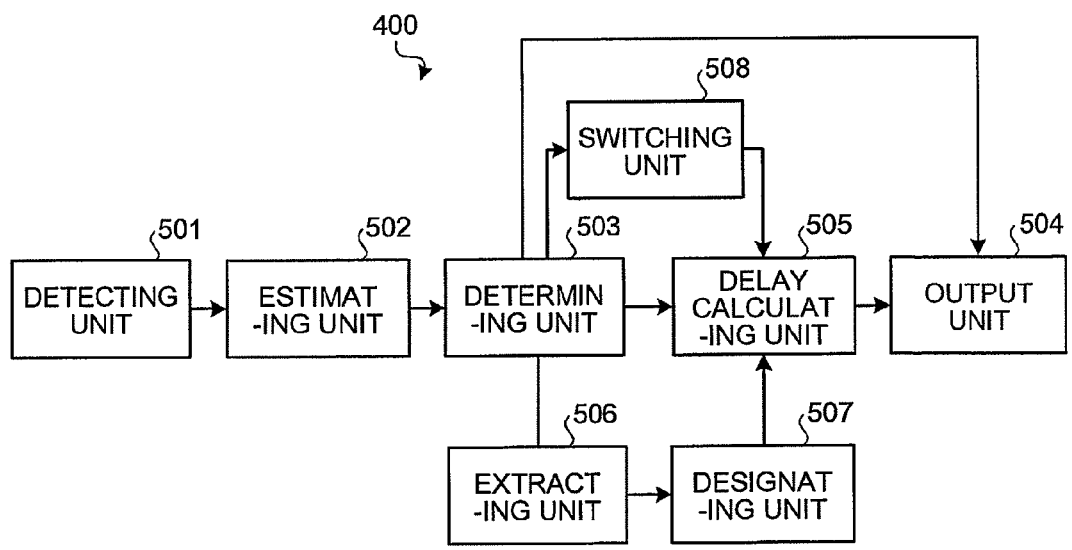
FIG. 5 is a block diagram of the delay analysis supporting apparatus.

FIG. 5 is a block diagram of the delay analysis supporting apparatus. As shown in FIG. 5, the delay analysis supporting apparatus 400 includes a detecting unit 501, an estimating unit 502, a determining unit 503, an output unit 504, a delay calculating unit 505, an extracting unit 506, a designating unit 507, and a switching unit 508.

These functions 501 to 508 are implemented by executing programs for these functions by the CPU, or by an input/output I/F. The programs are stored in a storage unit of the delay analysis supporting apparatus 400. Output data from the respective functions is stored in the storage unit. A function of a connection destination pointed by an arrow shown in FIG. 5 is implemented by reading output data from a function of a connection origin from the storage unit, and by causing the CPU to execute a program for the function of the connection destination.

First, the detecting unit detects a node to which a plurality of signals is input, from a circuit graph of an analysis object. The circuit graph is, for example, a digraph in which circuit devices that constitute a circuit of the analysis object are expressed as nodes in a graph. The nodes in the circuit graph are connected through edges that indicate the transmission direction. The circuit devices are, for example, a buffer, an inverter, an AND gate, a NAND gate, etc.

The node to which a plurality of signals is input is a node at which multiple signals run together. Specifically, it is a node that expresses a circuit device having a plurality of input pins such as an AND gate and a NAND gate. The circuit graph can be directly input to the delay analysis supporting apparatus 400, or can be generated from circuit information concerning the analysis object.

The circuit information is electronic data such as register transfer level (RTL) description and a net list. The circuit information can be acquired from an external device not shown. Alternatively, the circuit information can be acquired by an operation by a user or by extracting from a database or a library not shown.

The block-based analysis to calculate the delay distribution of each node in the circuit graph is performed by topologically scanning the circuit graph of the analysis object. Specifically, the cumulative delay of each node in the circuit graph is statistically calculated using the delay distribution of each of the circuit devices.

Figure 6:
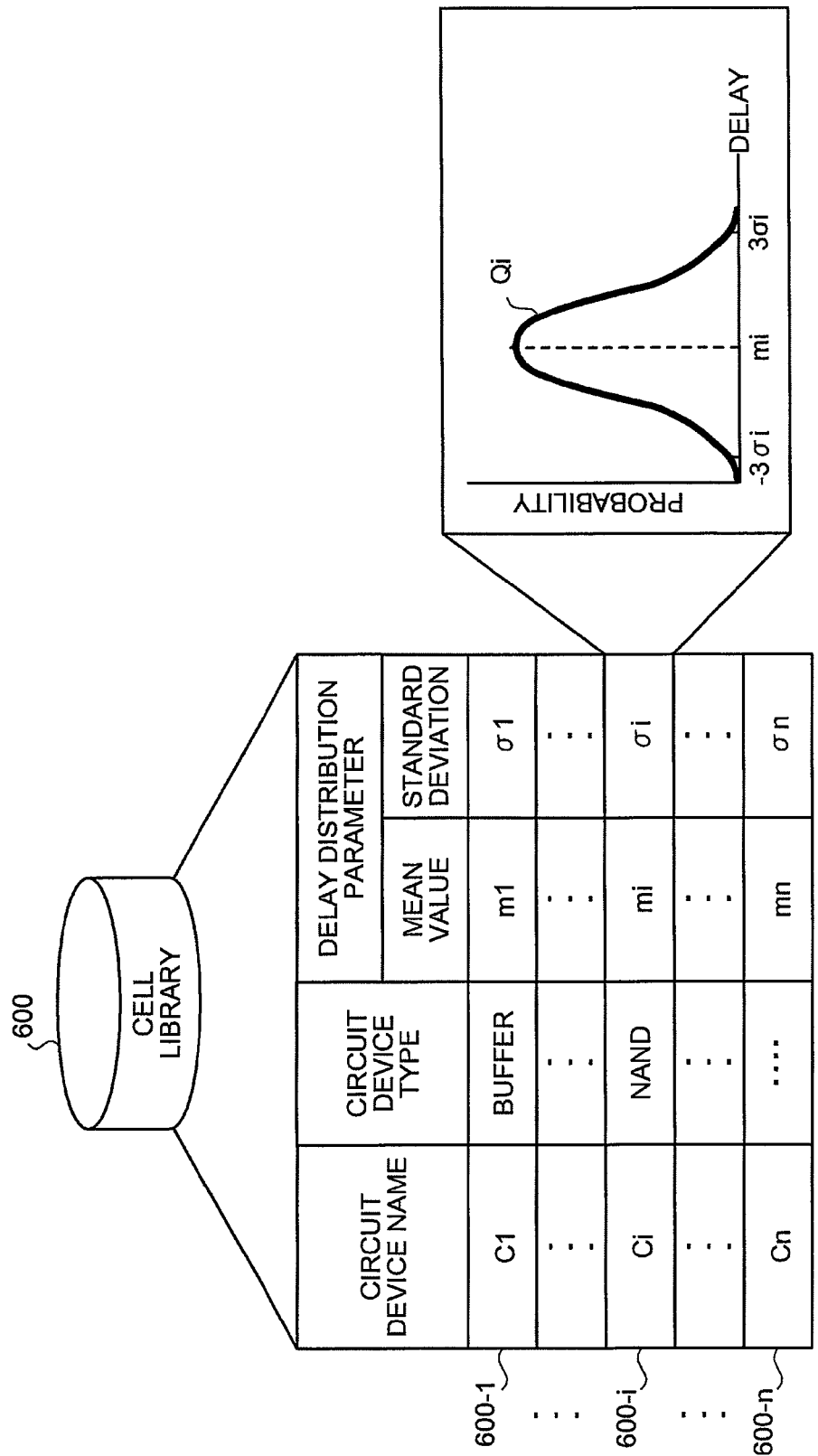
FIG. 6 illustrates contents stored in a cell library.

FIG. 6 illustrates contents stored in a cell library. In a cell library 600 stores delay information 600-1 to 600-n on delay for each circuit device. Specifically, the delay information 600-1 to 600-n includes a circuit device name, a circuit device type, and delay distribution parameters for each of the circuit devices.

The circuit device name indicates a name of a circuit device. The circuit device type indicates the type such as buffer, inverter, AND, and NAND. The delay distribution parameters indicate the delay distribution of a circuit device, and have a mean value m1 to mn and a standard deviation $\sigma 1$ to $\sigma 2$. Further, the delay information 600-1 to 600-n can include information on device sensitivity of each device.

As an example, the circuit device type of a circuit device Ci is NAND, and the delay distribution parameters include a mean value mi and a standard deviation $\sigma i$ (delay distribution Qi). In the block-based analysis, the delay information 600-1 to 600-n of the circuit devices indicating respective nodes in the circuit graph are extracted from the cell library 600, and the circuit delay is statistically calculated using the delay distribution (e.g. delay distribution Qi) of each node.

The detecting unit 501 identifies a node to which a plurality of signals is input based on the circuit device type and connection relation of nodes in the circuit graph during the block-based analysis, and detects the node. For example, from the circuit graph 100 shown in FIG. 1, the detecting unit 501 detects the node N3 to which signals from the nodes N1 and N2 are input.

The estimating unit 502 calculates an estimation value concerning an estimation error of the delay distribution of a node based on the delay distribution of a node group in a preceding stage that are connected to the node detected by the detecting unit 501. The delay distribution of the node group in the preceding stage is the delay distribution concerning the delay of each signal that is output from the nodes in the preceding stage, and specifically is the result of the block-based analysis of the nodes in the preceding stage.

The estimation value is an index that indicates influence of the delay distribution of the node at which multiple signals run together on the delay distribution of the entire circuit. In other words, the estimation value is used to estimate the estimation error in the approximate calculation of the delay distribution of the node at which multiple signals run together using the statistical MAX or the like.

Further specifically, the estimation value indicates an error penalty according to the estimation error, given to the node that is a cause of deteriorating the accuracy of the delay analysis. As this estimation value becomes larger, the influence of the delay distribution of the node on the delay distribution of the circuit becomes larger, and the possibility of deteriorating the accuracy in the delay analysis becomes higher.

The determining unit 503 determines whether the estimation value calculated by the estimating unit 502 is equal to or larger than a threshold. The threshold can be arbitrarily determined by a user using the keyboard 421, the mouse 422, or the input device 420. For example, such a value that the accuracy of the delay analysis is deteriorated to an unacceptable degree is predicted based on past analysis results and experimental rules, and predicted value is used as the threshold.

The output unit 504 outputs a result of determination made by the determining unit 503. Specifically, the output unit 504 outputs node information to identify a node for which the estimation value calculated by the estimating unit 502 is equal to or larger than the threshold. From this node information, it is possible to identify a node for which the estimation error in the statistical MAX is assumed to be large.

The form of output by the output unit 504 can be any of screen display on the display 431, print output by the printer 433, data output (saving) to a memory, and transmission to an external computer.

The delay calculating unit 505 calculates the delay distribution of the path passing through the node by performing the Monte Carlo simulation when the determining unit 503 determines that the estimation value is equal to or larger than the threshold. The Monte Carlo simulation is a method of estimating a true delay distribution from the average of delay distributions that are obtained as a result of repeating simulations using random numbers.

When it is predicted that the estimation error in the approximate calculation of the delay distribution of the node at which multiple signals run together is large, the delay distribution of a path passing through the node is acquired by the Monte Carlo simulation. Thus, the delay distribution of a path having high possibility of a high estimation error in the block-based analysis can be accurately estimated.

The extracting unit 506 extracts a path that passes through the node from the circuit graph when the determining unit 503 determines the estimation value is equal to or larger than the threshold. The designating unit 507 designates a partial circuit that is constituted of the path extracted by the extracting unit 506 as a circuit of reanalysis object.

FIG. 7 is a schematic diagram of a circuit of reanalysis object (I). A circuit graph 700 is a digraph in which circuit devices that constitute the reanalysis object are expressed as nodes N7 to N12 in a graph. In this circuit graph 700, the estimation value of the node N9 to which a plurality of signals are input is equal to or larger than the threshold.

The extracting unit 506 extracts a path P1 and a path P2 that pass through the node N9 whose estimation value is equal to or larger than the threshold from the circuit graph 700. The designating unit 507 designates a partial circuit that is constituted of the path P1 and the path P2 as a reanalysis object 710.

The delay calculating unit 505 performs the Monte Carlo simulation to acquire the delay distribution of the reanalysis object 710 designated by the designating unit 507. Thus, the delay distribution of a partial circuit constituted of the paths P1 and P2 that pass through the node N9 for which the estimation error by the statistical MAX is predicted to be large can be accurately estimated.

Specifically, the delay information 600-1 to 600-n of the circuit devices expressing the nodes N7 to N9, and N12 in the reanalysis object 710 is extracted from the cell library 600 shown in FIG. 6. By performing the Monte Carlo simulation using the extracted delay information 600-1 to 600n (e.g. delay distribution parameters), the delay distribution of the reanalysis object can be calculated.

The output unit 504 outputs a result of calculation obtained by the delay calculating unit 505. Specifically, the output unit 504 outputs a result of the block-based analysis of the circuit graph 700 as well as a result of the Monte Carlo simulation of the reanalysis object 710. Thus, the delay distribution of a partial circuit constituted of a path that passes through the node for which the estimation error in the statistical MAX is predicted to be large can be accurately estimated.

The determining unit 503 determines whether the node is included in a critical path. The critical path is a path that does not satisfy a condition for obtaining a target frequency by the delay of a path. The critical path in the circuit graph can be detected, for example, from a result of a timing analysis using STA or SSTA, which is a conventional technique.

The determining unit 503 can be configured to determine whether the estimation value estimated by the estimating unit 502 is equal to or larger than the threshold and the node is included in a critical path. In other words, the determining unit 503 determines whether the estimation error in the statistical MAX is predicted to be large and the node is included in a critical path that has a high possibility of having large influence on the delay of the entire circuit.

Figure 8:
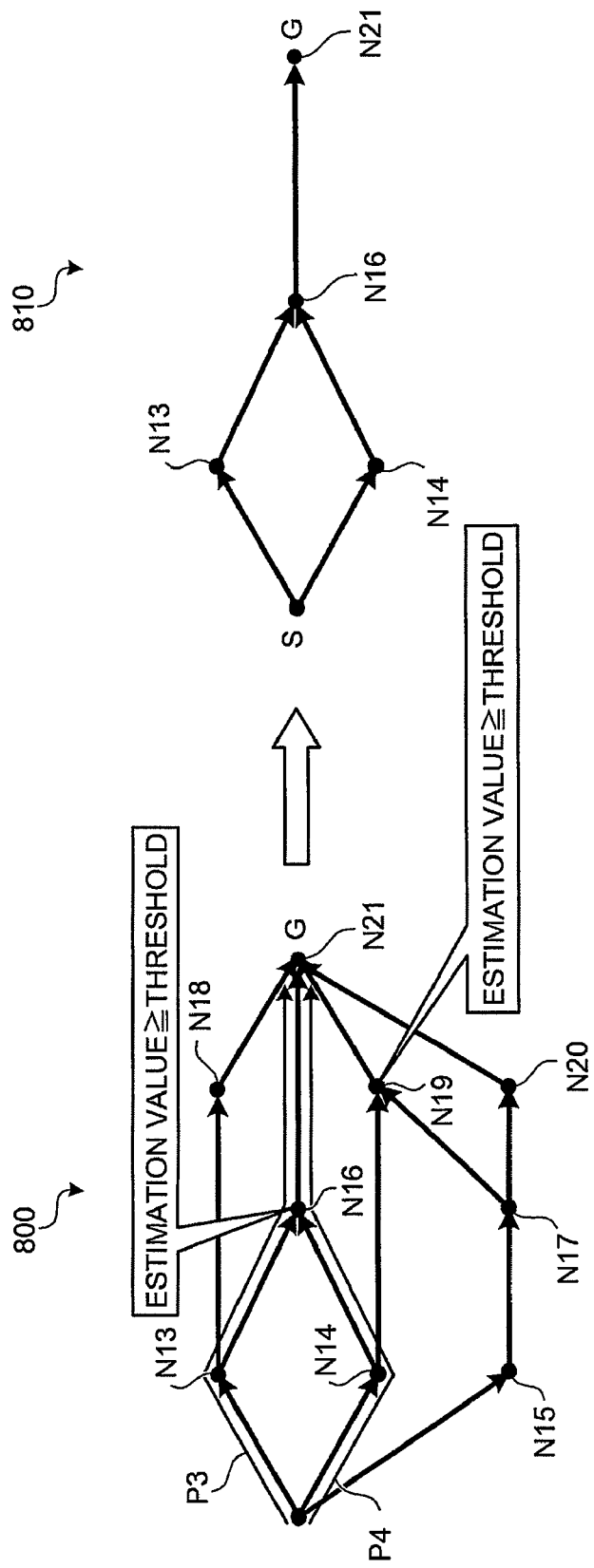
FIG. 8 is a schematic diagram of a circuit of reanalysis object (II)

Furthermore, the delay calculating unit 505 can be configured to calculate the delay distribution of a path that passes through the node by the Monte Carlo simulation when the determining unit 503 determines that the estimation value is equal to or larger than the threshold and that the node is included in a critical path. FIG. 8 is a schematic diagram of a circuit of reanalysis object (II). A circuit graph 800 is a digraph in which circuit devices that constitute a reanalysis object are expressed as nodes N13 to N21 in a graph. In this circuit graph 800, the estimation values of the nodes N16 and N19 to which a plurality of signals are input are equal to or larger than the threshold. A path P3 shown in FIG. 8 is a critical path.

The extracting unit 506 extracts, from the circuit graph 800, paths P3 and P4 passing through the node 16 for which the estimation value is equal to or larger than the threshold and that is included in the critical path P3. The designating unit 507 designates a partial circuit that is constituted of the paths P3 and P4 extracted by the extracting unit 506 as a reanalysis object 810. The delay calculating unit 505 performs the Monte Carlo simulation to acquire the delay distribution of the reanalysis object 810.

By thus determining a path passing through the node N16 for which the estimation value is equal to or larger than the threshold and that is included in a critical path as the reanalysis object 810, the circuit scale of a reanalysis object can be smaller compared to the case where the reanalysis object is determined merely based on the estimation value being equal to or larger than the threshold to be a partial circuit constituted of a path passing through the nodes N16 and N19, thereby achieving high speed delay analysis.

The determining unit 503 determines whether a device sensitivity that indicates a change rate of parameters concerning the delay distribution of the node is equal to or higher than a threshold. The device sensitivity is a change rate of the circuit delay when a mean value of the delay distribution of the circuit device expressing the node is subjected to fine adjustment (for example, 1 [ps]).

The higher the device sensitivity is, the less adjustment work is required to improve the circuit delay of the analysis object. The device sensitivity of the node can be acquired by extracting from a database or the cell library 600, not shown. The device sensitivity can be acquired, for example, by STA or SSTA, which is a conventional technique. For a specific method of acquiring the device sensitivity, for example, Japanese Patent Laid-Open Publication No. 2006-268479 can be referred.

The determining unit 503 can be configured to determine whether the estimation value is equal to or larger than the threshold and the device sensitivity is equal to or higher than a threshold. In other words, the determining unit 503 determines whether the estimation error in the statistical MAX is large and the possibility of improvement of the circuit delay is high.

The delay calculating unit 505 can be configured to calculate the delay distribution of the path passing through the node by the Monte Carlo simulation when the determining unit 503 determines that the estimation value is larger than the threshold and the device sensitivity is higher than the threshold.

Figure 9:
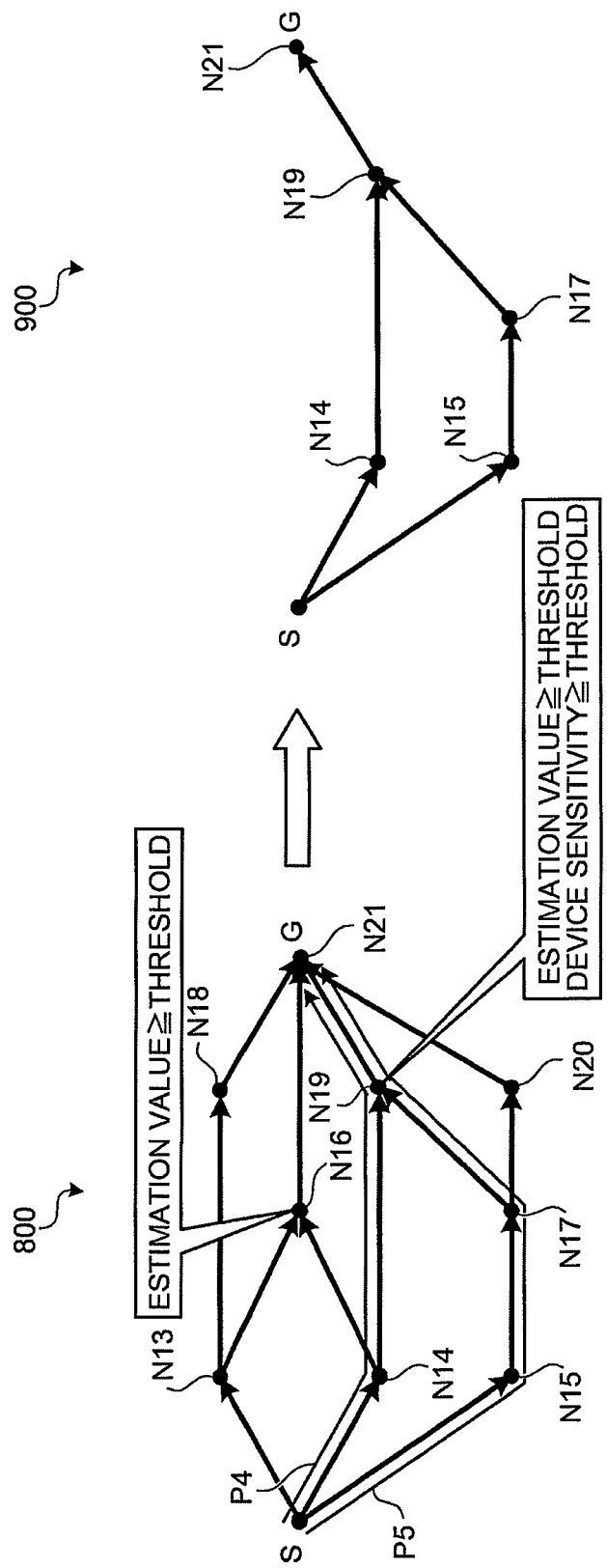
FIG. 9 is a schematic diagram of a circuit of reanalysis object (III)

FIG. 9 is a schematic diagram of a circuit of a reanalysis object (III). In this example, the estimation values of the nodes N16 and N19 are larger than the threshold and the device sensitivity of the node N19 is higher than the threshold.

The extracting unit 506 extracts paths P4 and P5 that pass through the node N19 whose estimation value is higher than the threshold and the device sensitivity is higher than the threshold from the circuit graph 800. The designating unit 507 designates a partial circuit that is constituted of the paths P4 and P5 as a reanalysis object 900. The delay calculating unit 505 performs the Monte Carlo simulation to acquire the delay distribution of the reanalysis object 900.

By thus designating a path that passes through the node N19 whose the estimation value is equal to or larger than the threshold and the device sensitivity is higher than the threshold as the reanalysis object, the circuit scale of a reanalysis object can be smaller compared to the case where the reanalysis object is determined merely based on the estimation value being equal to or larger than the threshold to be a partial circuit constituted of a path passing through the nodes N16 and N19, thereby achieving high speed delay analysis.

Furthermore, the delay calculating unit 505 can be configured to calculate the delay distribution of a path that passes through the node by the Monte Carlo simulation when the determining unit 503 determines that the estimation value is equal to or larger than the threshold, that the device sensitivity is equal to or higher than the threshold, and that the node is included in a critical path. By this method, it is possible to make the circuit scale smaller than the above example and to achieve high speed delay analysis more effectively.

Moreover, the delay calculating unit 505 calculates the delay distribution of a subtree that includes the node by the Monte Carlo simulation when the determining unit 503 determines that the estimation value is equal to or larger than the threshold. The subtree is a partial circuit in a tree form that is constituted of the node and a node group in a subsequent stage to the node.

Specifically, the delay calculating unit 505 calculates the delay distribution of the subtree including the node by conducting the Monte Carlo simulation using the delay distribution indicating the delay up to the nodes in a preceding stage of the node obtained by the block-based analysis as an input.

Furthermore, as described above, the delay calculating unit 505 can be configured to calculate the delay distribution of the subtree including the node by conducting the Monte Carlo simulation depending on a result of determination not only whether the estimation value is equal to or larger than the threshold, but also whether it is included in a critical path, and whether the device sensitivity is equal to or higher than the threshold.

The switching unit 508 switches the delay analysis to calculate the delay distribution of the circuit graph from the block-based analysis to the Monte Carlo simulation when the determining unit 503 determines that the estimation value is equal to or larger than the threshold. In other words, when the estimation value is determined to be equal to or larger than the threshold during the block-based analysis, the block-based analysis is stopped and the Monte Carlo simulation is conducted.

Furthermore, the delay calculating unit 505 calculates the delay distribution of the subtree including the node by the Monte Carlo simulation when the switching unit 508 switches from the block-based analysis to the Monte Carlo simulation. Specifically, the delay calculating unit 505 calculates the delay distribution of the subtree including the node by conducting the Monte Carlo simulation using the delay distribution indicating the delay up to the nodes in a preceding stage of the node obtained by the block-based analysis as an input.

Figure 10:
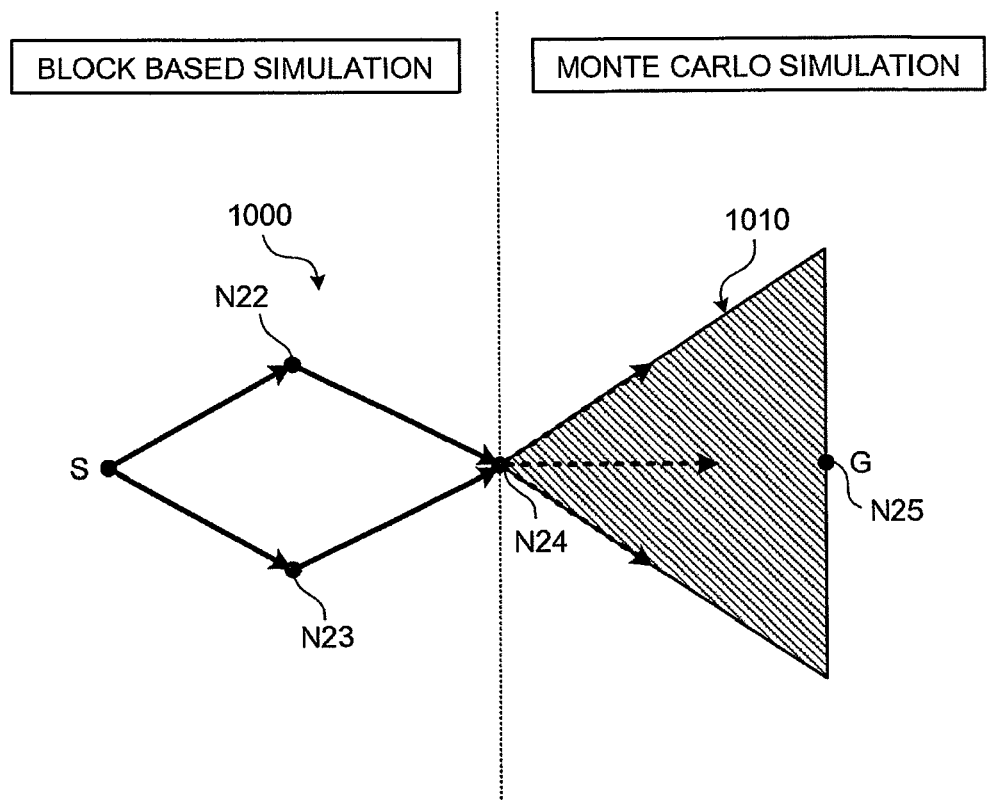
FIG. 10 is a schematic diagram of a switching processing (I)

FIG. 10 is a schematic diagram of a switching processing (I). In a circuit graph 1000, the estimation value of a node N24 is equal to or larger than the threshold. At the point of time when the delay distribution of the nodes N22 and N23 in the preceding stage to the node N24 is calculated, the switching unit 508 stops the block-based analysis and switches the delay analysis to calculate the delay distribution of the circuit graph 1000 from the block-based analysis to the Monte Carlo simulation.

The extracting unit 506 extracts a subtree 1010 that includes the node N24 from the circuit graph 1000. The subtree 1010 is a partial circuit that is constituted of a path from the node N24 to the node N25. The delay calculating unit 505 calculates the delay distribution of the subtree 1010 by the Monte Carlo simulation.

Thus, the delay distribution of the subtree 1010 that includes the node N24 for which the estimation error in the statistical MAX is predicted to be large can be estimated accurately. Further, the block-based analysis is stopped when the estimation value of the node N24 is determined to be equal to or larger than the threshold, thereby reducing analysis work for the block-based analysis to calculate the delay distribution of the subtree 1010.

The delay calculating unit 505 can be configured to calculate the delay distribution of the node by conducting the Monte Carlo simulation as a result of the switching by the switching unit 508. In other words, when the estimation value is determined to be equal to or larger than the threshold during the execution of the block-based analysis, the delay calculating unit 505 stops the block-based analysis and calculates the delay distribution of the node by the Monte Carlo simulation.

The switching unit 508 can be configured to switch the delay analysis to calculate the delay distribution of the circuit graph from the Monte Carlo simulation to the block-based analysis when the delay distribution of the node has been calculated by the delay calculating unit 505. The delay calculating unit 505 can be configured to calculate the delay distribution of a node in a subsequent stage to the node by the block-based analysis using the delay distribution of the node, when the switching unit 508 has switched the delay analysis from the Monte Carlo simulation to the block-based analysis.

Figure 11:
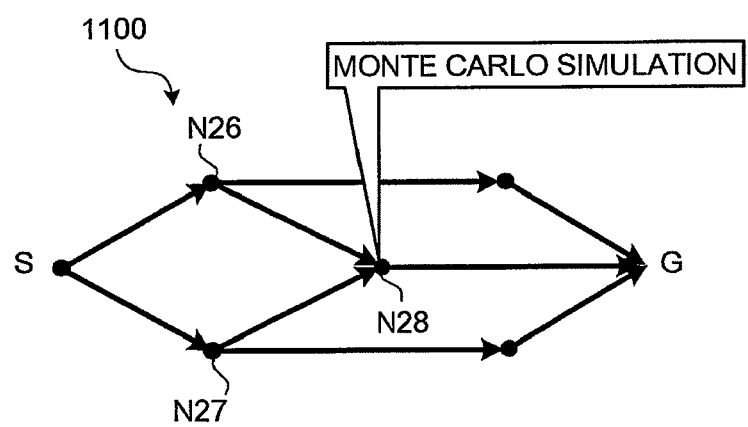
FIG. 11 is a schematic diagram of a switching processing (II)

FIG. 11 is a schematic diagram of a switching processing (II). In the circuit graph 1100, the estimation value of the node N28 is equal to or larger than the threshold. The switching unit 508 stops the block-based analysis and switches the delay analysis to calculate the delay distribution of the circuit graph 1100 from the block-based analysis to the Monte Carlo simulation at the point of time when the delay distributions of the nodes N26 and N27 in a preceding stage to the node N28 are calculated.

The extracting unit 506 extracts the node N28 from the circuit graph 1100. The delay calculating unit 505 calculates the delay distribution of the node 28 extracted by the extracting unit 506 by conducting the Monte Carlo simulation.

Thereafter the switching unit 508 switches the delay analysis to calculate the delay distribution of the circuit graph 1100 from the block-based analysis to the Monte Carlo simulation. The delay calculating unit 505 calculates the delay distribution of a node (to the ending point G) in a subsequent stage to the node N28 by the block-based analysis using the delay distribution of the node N28.

Such a configuration that only the delay distribution of the node N28 for which the estimation value is predicted to be large in the approximate calculation of the delay distribution of a node at which a plurality of signals run together is calculated by the Monte Carlo simulation enables high speed and highly accurate delay analysis.

The calculation result of the delay calculating unit 505 output by the output unit 504 can be the delay distribution of a circuit graph of an analysis object, or the delay distribution of each path in a circuit graph. The output unit 504 can output a calculation result according to the method (block-based analysis or Monte Carlo simulation) of delay analysis.

Figure 12:
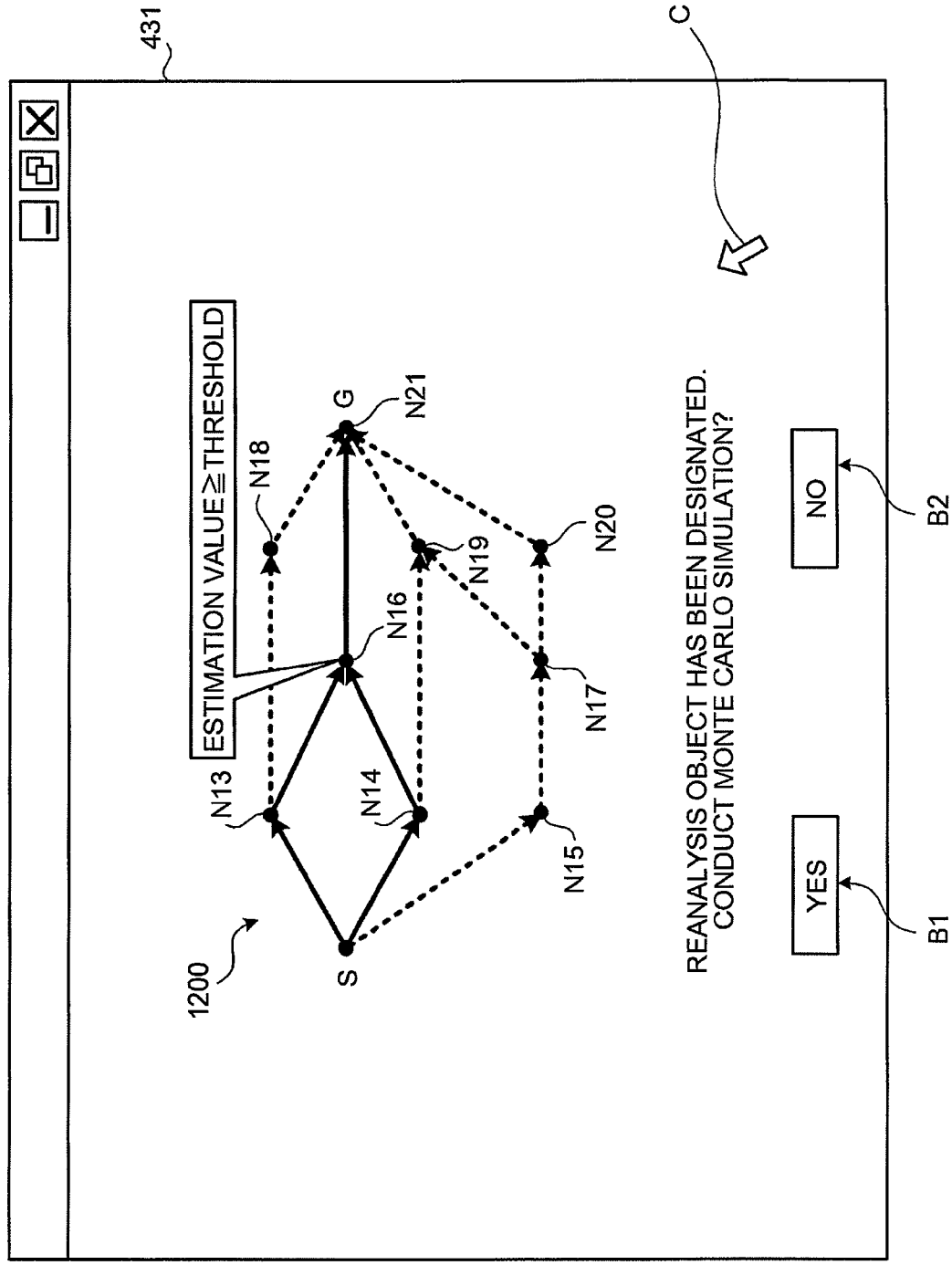
FIG. 12 illustrates an example of a display screen on a display.

Furthermore, the output unit 504 can output a circuit graph of a reanalysis object that expresses the reanalysis object designated by the designating unit 507 from among circuit graphs of analysis object. FIG. 12 illustrates an example of a display screen on the display. In the example shown in FIG. 12, a reanalysis circuit graph 1200 that expresses the circuit of reanalysis object concerning the circuit graph 800 shown in FIG. 8 is displayed on the display 431.

This shows that the estimation value of the node N16 at which a plurality of signals run together is equal to or larger than the threshold. Further, it shows that the reanalysis circuit graph 1200 that is constituted of a path passing through the node N16 is an analysis object of the Monte Carlo simulation.

The delay analysis by the Monte Carlo simulation is started when a cursor C is moved to click a Yes button B1 on the display 431, for example, by operating the keyboard 421 or the mouse 422.

It can be configured that when a No button B2 is clicked, on the other hand, the circuit information of the reanalysis circuit graph 1200 is recorded on the HD or on the optical disk 411. Alternatively, it can be configured that the delay analysis by the Monte Carlo simulation is cancelled. Further, the Monte Carlo simulation for the reanalysis circuit graph 1200 can be conducted by an external computer device using the circuit information of the reanalysis circuit graph 1200 stored in the optical disk 411.

The estimating unit 502 can estimate an estimation value, for example, using an upper-limit delay distribution and a lower-limit delay distribution. The upper-limit delay distribution indicates variation of upper limit values of the delay of a node group in a preceding stage. The lower-limit delay distribution indicates variation of lower limit values of the delay of the node group in a preceding stage.

The upper-limit delay distribution and the lower-limit delay distribution can be obtained from an external device or by extracting from a database or a library not shown. Alternatively, the upper-limit delay distribution and the lower-limit delay distribution can be calculated from the delay distribution of the node group in the preceding stage to the node, by a conventional method.

For specific method of calculating the upper limit delay distribution and the lower-limit delay distribution, for example, Proc. of DATE, pages 62-67, 2003 IEEE, titled "Statistical Timing Analysis using Bounds" by Aseem Agarwal, David Blaauw, Vladimir Zolotov, and Sarma Vrudhula can be referred.

The estimating unit 502 can estimate an estimation value using a mean value of the upper-limit delay distribution and a mean value of the lower-limit delay distribution.

Figure 13:
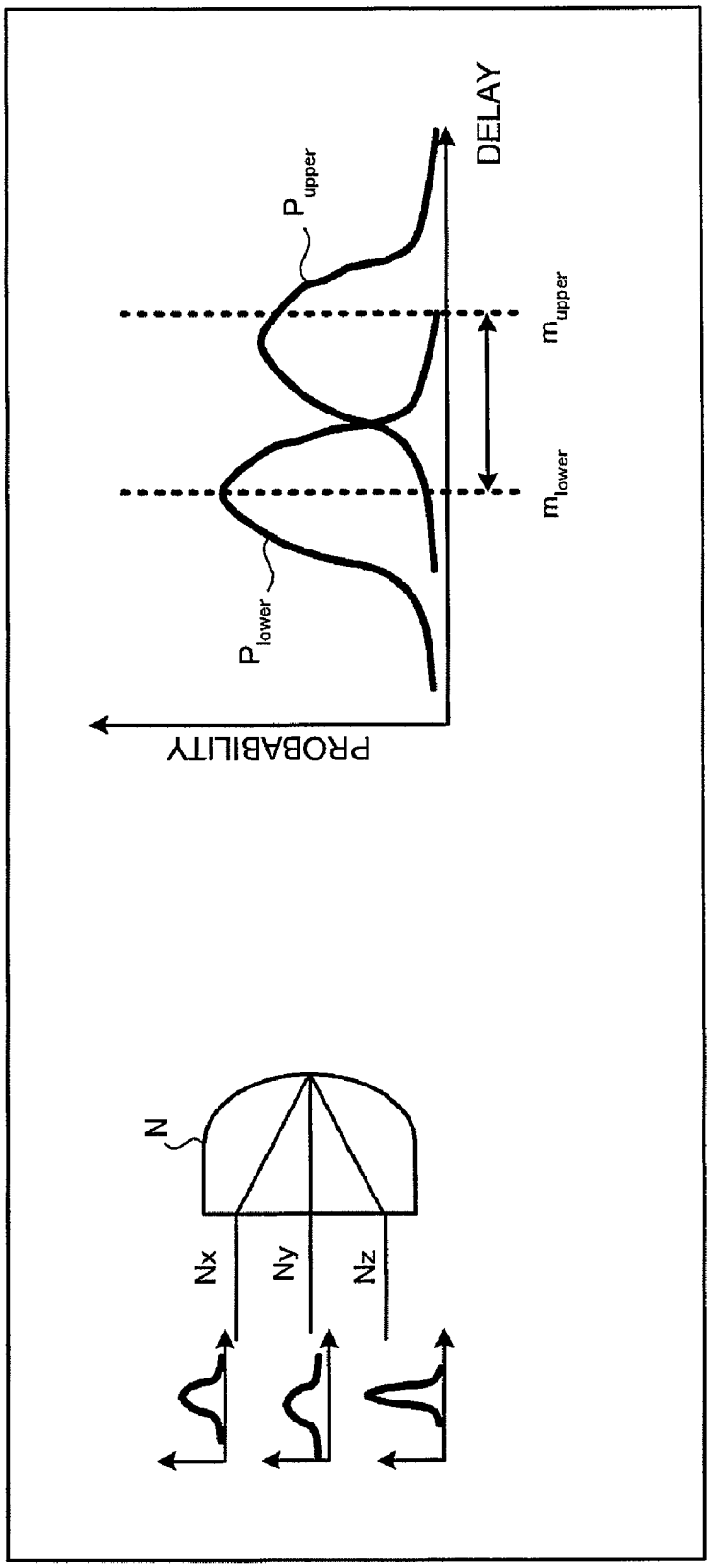
FIG. 13 is a schematic diagram of an estimation value calculating method (I)

FIG. 13 is a schematic diagram of an estimation value calculating method (I). An upper-limit delay distribution Pupper shown in FIG. 13 is a probability density distribution that indicates variation of upper values of the delay of a node group Nx, Ny, and Nz in a preceding stage to the node N. A lower-limit delay distribution $P_{lower}$ is a probability density distribution that indicates variation of lower values of the delay of the node group Nx, Ny, and Nz in the preceding stage to the node N.

When a mean value of the upper-limit delay distribution Pupper is mupper and a mean value of the lower-limit delay distribution Plower is mlower, an estimation value Z for the estimation error of the delay distribution of the node N can be calculated, for example, by Equation 4 below.

$$Z = m_{upper} - m_{lower} \quad (4)$$

Moreover, the estimating unit 502 can estimate the estimation value, for example, using the mean value and a standard deviation of the upper-limit delay distribution and the mean value and a standard deviation of the lower-limit delay distribution.

Figure 14:
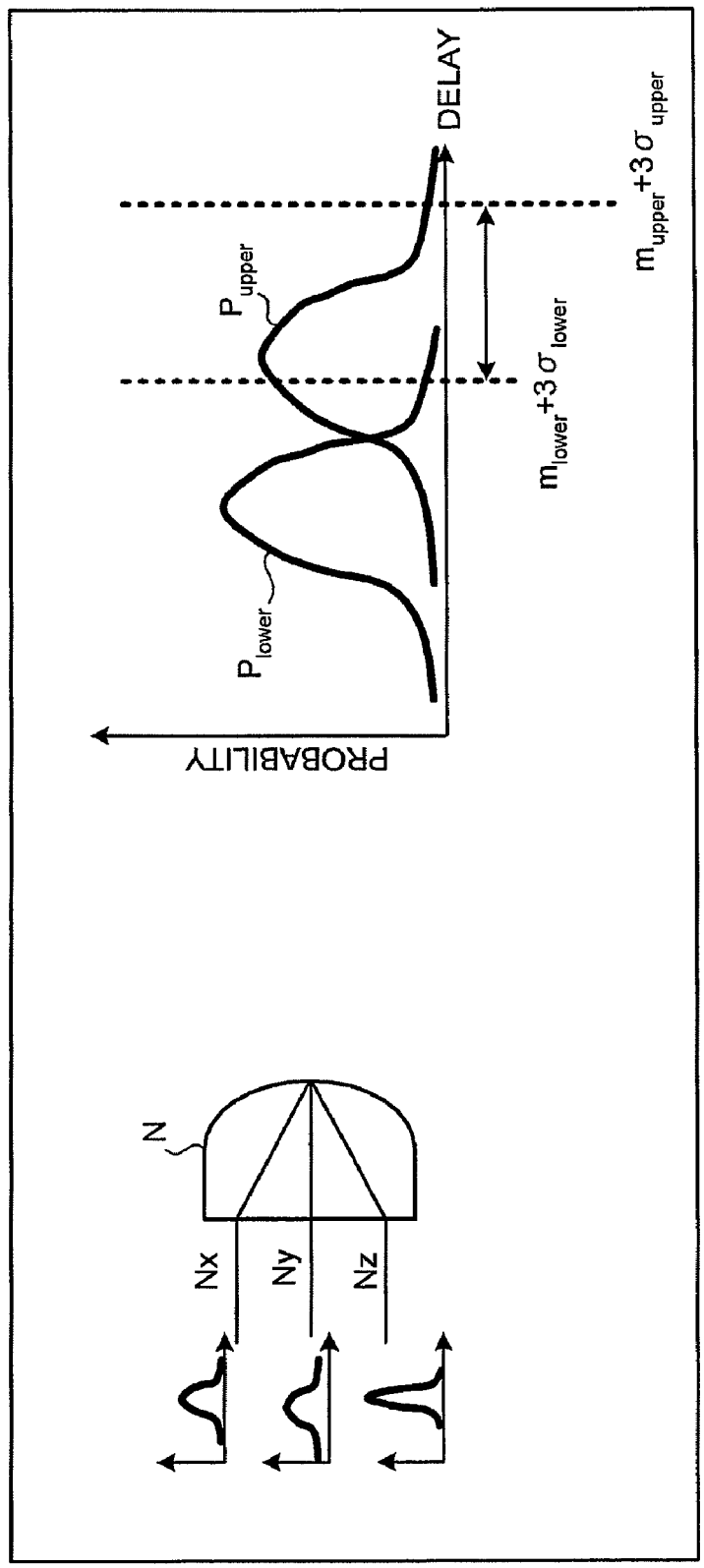
FIG. 14 is a schematic diagram of an estimation value calculating method (II)

FIG. 14 is a schematic diagram of an estimation value calculating method (II). In the example shown in FIG. 14, when the standard deviation of the upper-limit delay distribution $P_{upper}$ is σupper, and the standard deviation of the lower-limit delay distribution $P_{lower}$ is σlower, the estimation value Z can be calculated, for example, by Equation 5 below. A value (3σupper and 3σlower) added to the mean value is such a value that yield is about 99% when a sum of this value and the mean value represents the worst value of the delay.

$$Z = (m_{upper} + 3\sigma\text{upper}) - (m\text{lower} + 3\sigma_{lower}) \quad (5)$$

Furthermore, based on the mean value of a delay distribution whose mean value is the largest among delay distributions of the node group in the preceding stage, the estimation value can be a value that is included within a predetermined range and that is different from the delay distribution whose mean value is the largest. The predetermined range can be arbitrarily determined. For example, using the standard deviation σ, the range can be set to ±3 from the mean value.

Figure 15:
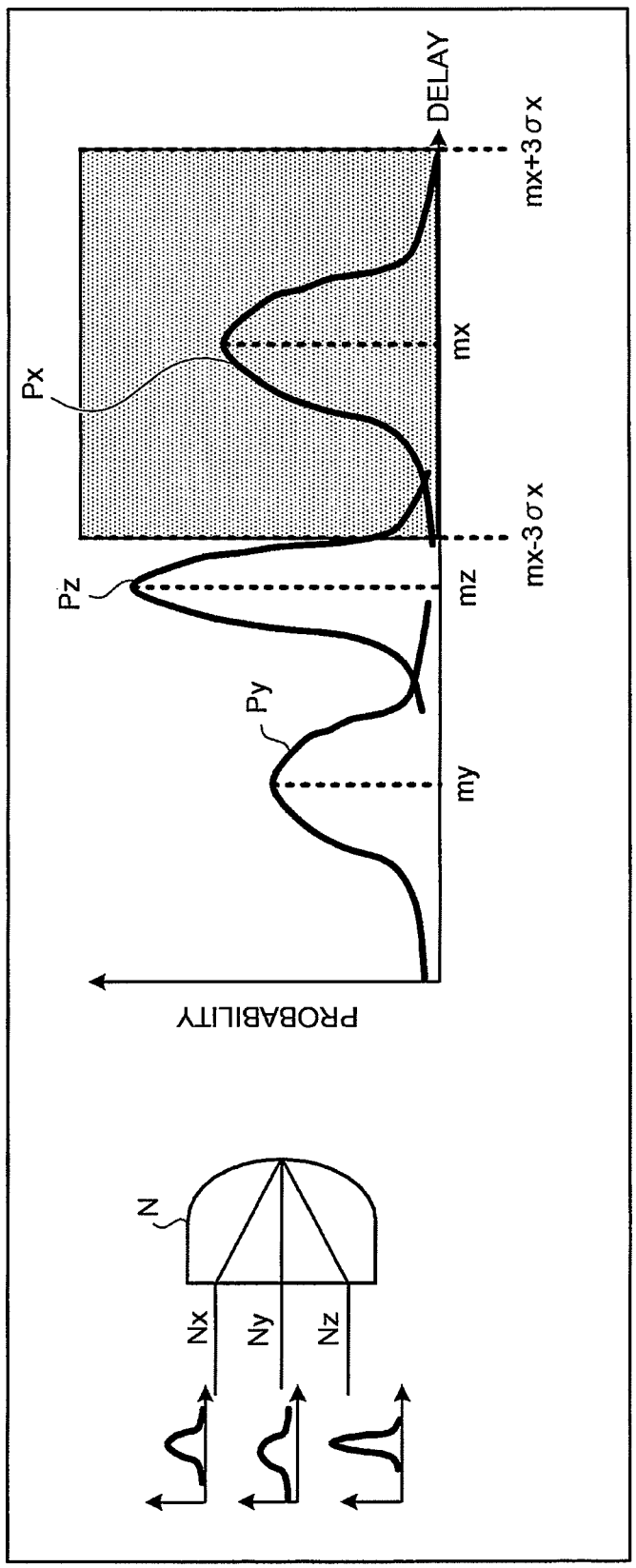
FIG. 15 is a schematic diagram of an estimation value calculating method (III)

FIG. 15 is a schematic diagram of an estimation value calculating method (III). Delay distributions Px, Py, and Pz are the delay distributions of the node group Nx, Ny, and Nz in the preceding stage to the node N. Mean values of the delay distributions Px, Py, and Pz are mx, my, and mz (mx>my>mz), respectively.

When the predetermined range is set to ±3 from the mean value, if the standard deviation of the delay distribution Px is σx, a value "1" of the delay distribution (only the delay distribution Pz in this example) included in the range of ±3σx from the mean value mx of the delay distribution Px is the estimation value. In FIG. 15, the respective delay distributions Px, Py, and Pz are separated in an appropriate range (for example, ±6σ from the mean value) from the mean values mx, my, and mz.

Figure 16:
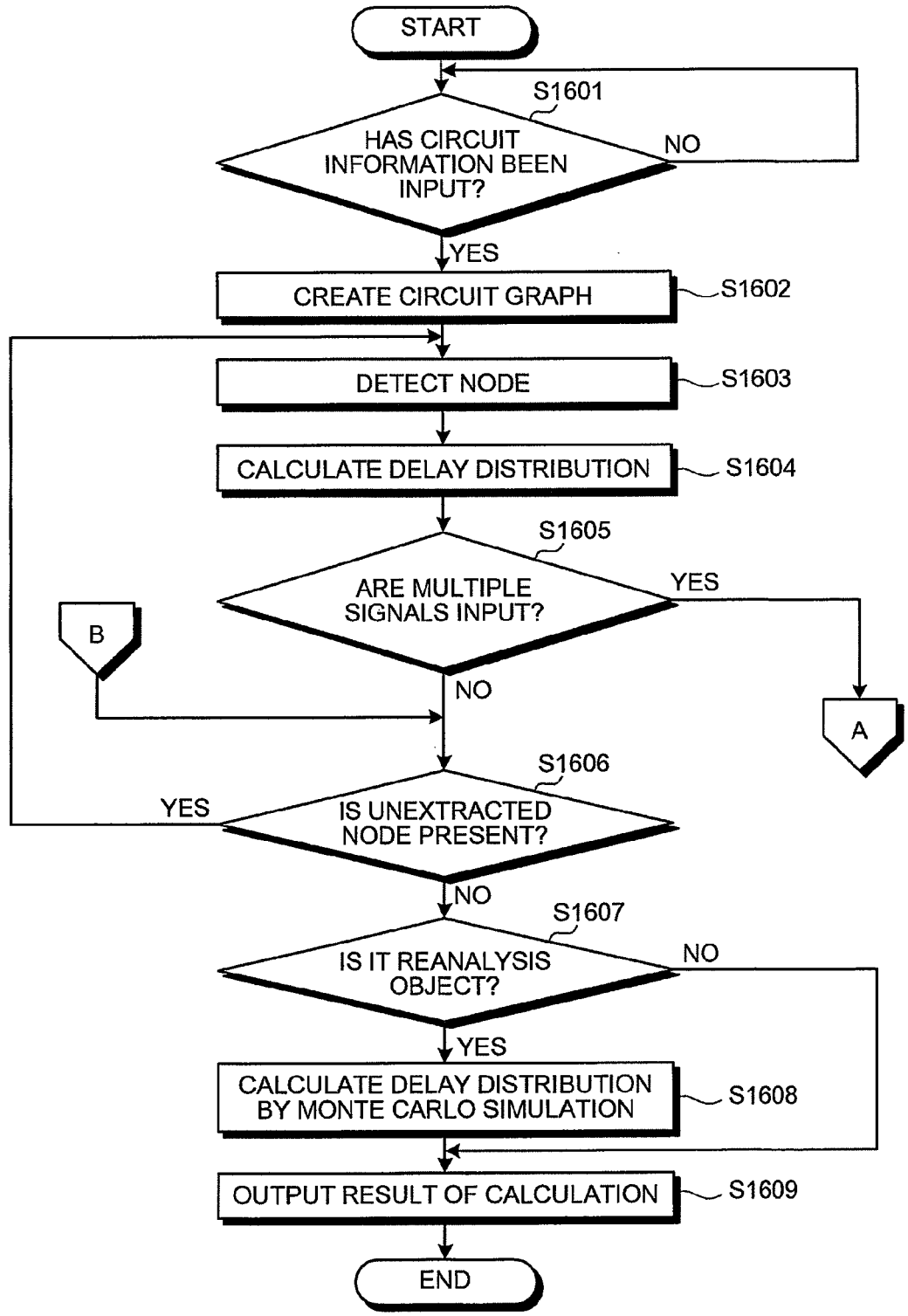
FIG. 16 is a flowchart of a delay analysis performed by the delay analysis supporting apparatus (Ia)
Figure 17:
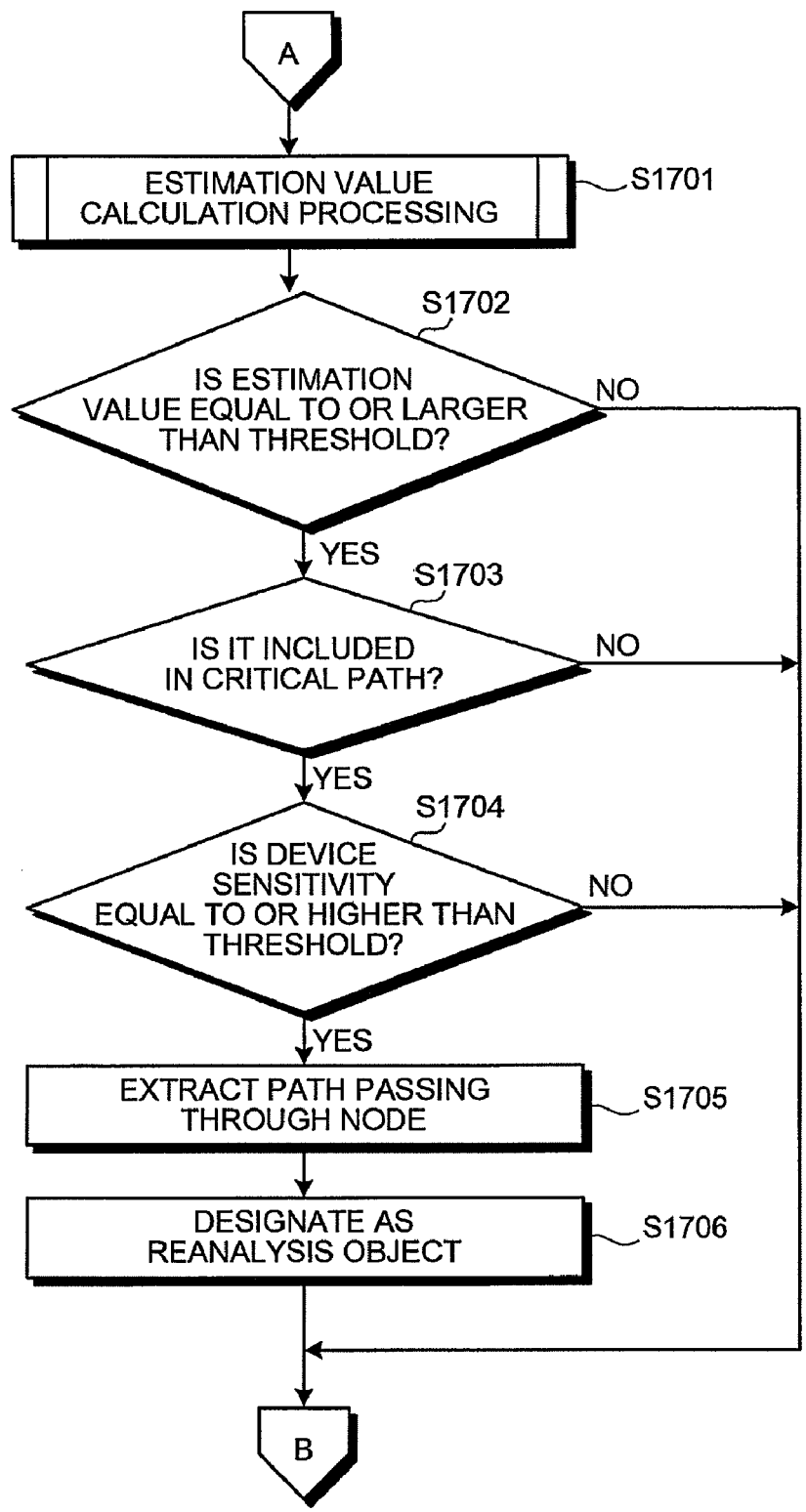
FIG. 17 is a flowchart of the delay analysis (Ib)

FIGS. 16 and 17 are flowcharts of a delay analysis performed by the delay analysis supporting apparatus (I).

As shown in FIG. 16, first, waiting occurs until circuit information of a circuit of analysis object is input (step S1601: NO), and when the circuit information is input (step S1601: YES), a circuit graph of the analysis object is created from the circuit information (step S1602).

Thereafter, the detecting unit 501 detects a node from the circuit graph by topologically scanning the circuit graph (step S1603). The delay calculating unit 505 conducts the block-based analysis to calculate the delay distribution of the detected node (step S1604).

Next, it is determined whether the node detected at step S1603 is a node to which a plurality of signals is input (step S1605). When it is the node to which a plurality of nodes are input (step S1605: YES), the process proceeds to step S1701 shown in FIG. 7.

As shown in FIG. 17, an estimation value calculation to calculate the estimation value of the estimation error of the delay distribution of the node is performed based on the delay distribution of the node group in the preceding stage to the node detected by the detecting unit 501 (step S1701).

Subsequently, the determining unit 503 determines whether the calculated estimation value is equal to or larger than the threshold (step S1702). When the estimation value is smaller than the threshold (step S1702: NO), the process proceeds to step S1606 shown in FIG. 16.

On the other hand, when the estimation value is equal to or larger than the threshold (step S1702: YES), the determining unit 503 determines whether the node is included in a critical path (step S1703). When the node is not included in a critical path (step S1703: NO), the process proceeds to step S1606 shown in FIG. 16.

On the other hand, when the node is included in a critical path (step S1703: YES), the determining unit 503 determines whether the device sensitivity indicating a change rate of parameters concerning the delay distribution of the node is equal to or higher than a threshold (step S1704). When the device sensitivity is lower than the threshold (step S1704: NO), the process proceeds to step S1606 shown in FIG. 16.

On the other hand, when the device sensitivity is equal to or higher than the threshold (step S1704: YES), the extracting unit 506 extracts a path that passes through the node from the circuit graph (step S1705). The designating unit 507 designates a partial circuit constituted of the extracted path as a reanalysis object (step S1706), and the process proceeds to step S1606 shown in FIG. 16.

Referring back to FIG. 16, when a node to which a plurality of signals is input is not detected at step S1605 (step S1605: NO), it is determined whether a node that has not been detected by the detecting unit 501 is present (step S1606). When a node that has not been detected is present (step S1606: YES), the process returns to step S1603 and a series of processes is repeated.

On the other hand, when a node that has not been detected is not present (step S1606: NO), it is determined whether a circuit of the reanalysis object that is determined at step S1706 shown in FIG. 17 is present (step S1607). When the reanalysis object is present (step S1607: YES), the delay calculating unit 505 conducts the Monte Carlo simulation to calculate the delay distribution of the reanalysis object designated by the designating unit 507 (step S1608).

The output unit 504 outputs a result of calculation at steps S1604 and S1608 (step S1609), and a series of process in this flowchart is ended.

On the other hand, when a reanalysis object is not present (step S1607: NO), the output unit 504 outputs a result of calculation at step S1604 (step S1609), and a series of processes in this flowchart is ended.

Thus, among nodes for which the estimation error in an approximate solution by the statistical MAX or the like is predicted to be large, the delay distribution of a partial circuit that is constituted of a path passing through a node that is present on a critical path having large influence on the circuit delay and that has high possibility that the circuit delay is improved can be automatically calculated by the Monte Carlo simulation.

Figure 18:
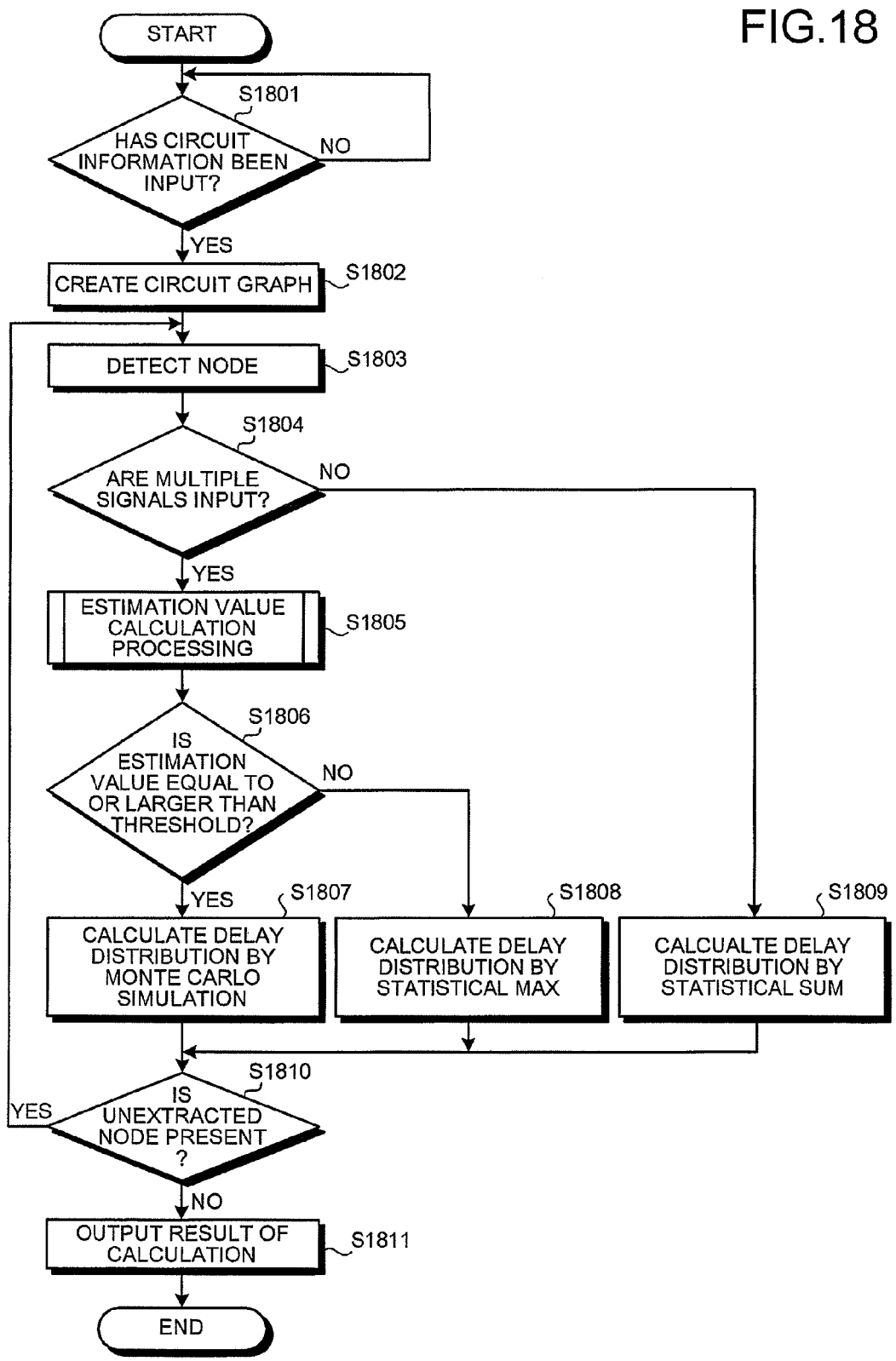
FIG. 18 is a flowchart of a delay analysis performed by the delay analysis supporting apparatus (II)

FIG. 18 is a flowchart of a delay analysis performed by the delay analysis supporting apparatus (II). As shown in FIG. 18, first, the delay analysis supporting apparatus 400 waits until the circuit information of an analysis object is input (step S1801: NO). When the circuit information is input (step S1801: YES), the delay analysis supporting apparatus 400 creates a circuit graph of the analysis object from the circuit information (step S1802).

Thereafter, the detecting unit 501 detects a node from the circuit graph by topologically scanning the circuit graph (step S1803). It is then determined whether the node is a node to which a plurality of signals is input (step S1804).

When a node to which a plurality of signals is input is detected (step S1804: YES), the estimating unit 502 performs an estimation value calculation to calculate the estimation value of the estimation error of the delay distribution of the node is performed based on the delay distribution of the node group in the preceding stage to the node detected by the detecting unit 501 (step S1805).

Subsequently, the determining unit 503 determines whether the calculated estimation value is equal to or larger than the threshold (step S1806). When the estimation value is equal to or larger than the threshold (step S1806: YES), the delay calculating unit 505 calculates the delay distribution of the node by the statistical MAX (step S1808). It is then determined whether a node that has not been detected by the detecting unit 501 is present (step S1810). When a node that has not been detected is present (step S1810: YES), the process returns to step S1803 and a series of processes is repeated.

When a node to which a plurality of signals is input is not detected at step S1804 (step S1804: NO), the delay calculating unit 505 calculates the delay distribution of the node detected at step S1803 by the statistical SUM (step S1809), and the process proceeds to step S1810.

When a node that has not been detected is not present (step S1810: NO), the output unit 504 outputs a result of calculation performed by the delay calculating unit 505 (step S1811), and a series of processes in this flowchart is ended.

Thus, only the delay distribution of the node for which the estimation error of the approximate solution in the statistical MAX or the like is predicted to be large can be automatically calculated by the Monte Carlo simulation.

Figure 19:
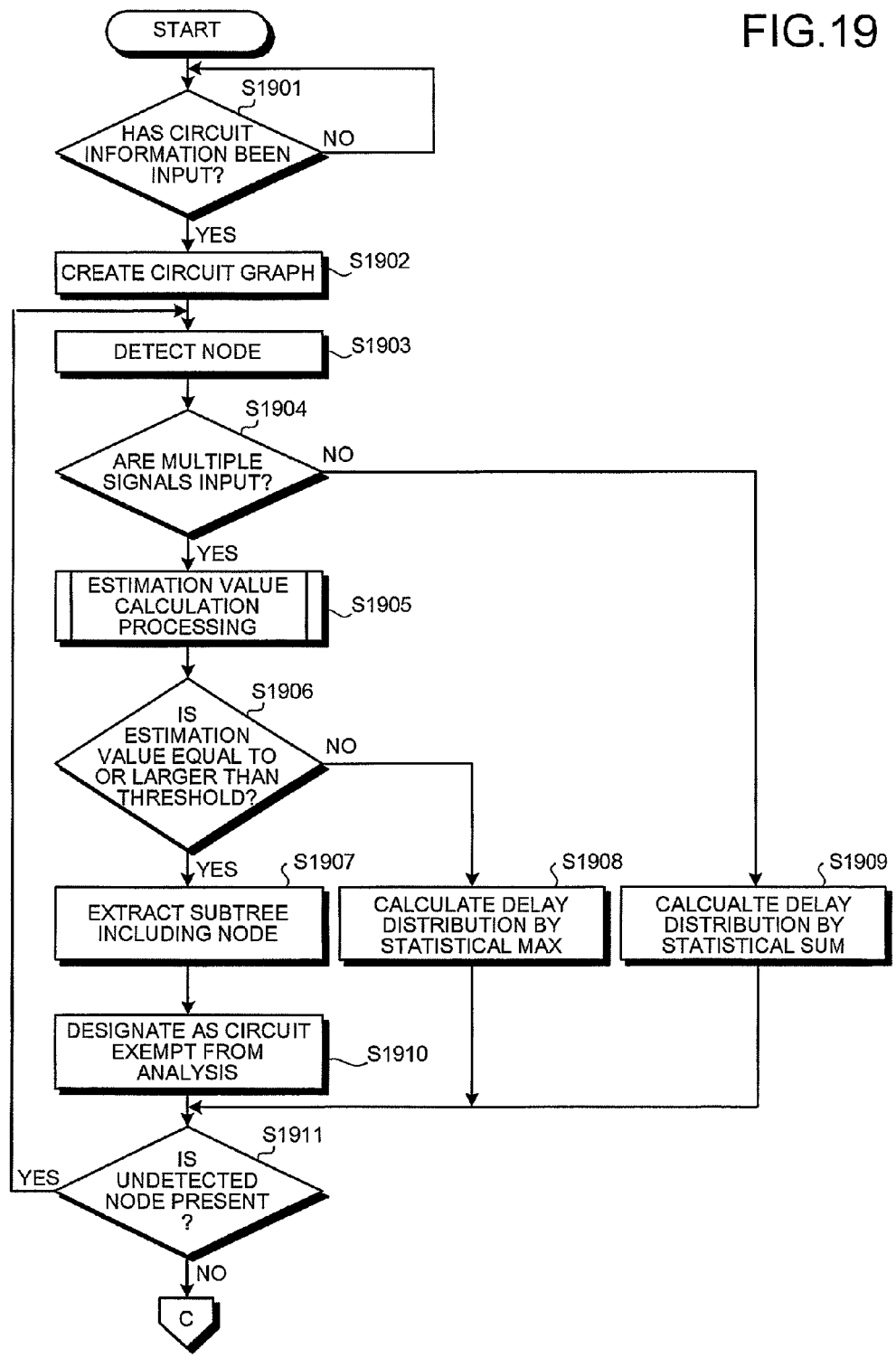
FIG. 19 is a flowchart of a delay analysis performed by the delay analysis supporting apparatus (IIIa)
Figure 20:
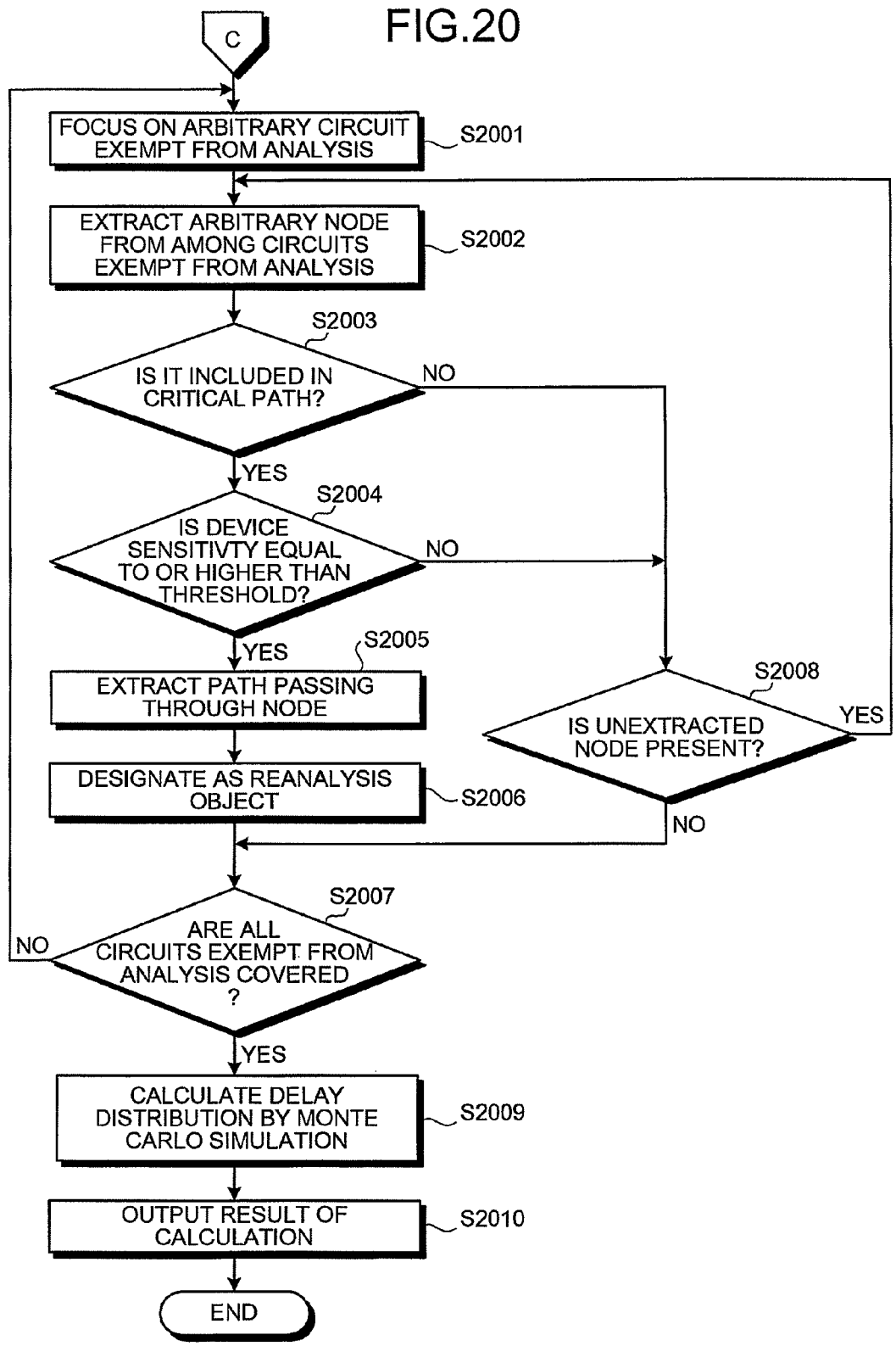
FIG. 20 is a flowchart of the delay analysis (IIIb)

FIGS. 19 and 20 show another example of the delay analysis performed by the delay analysis supporting apparatus (III).

As shown in FIG. 19, the delay analysis supporting apparatus 400 waits until the circuit information of an analysis object is input (step S1901: NO). When the circuit information is input (step S1901: YES), the delay analysis supporting apparatus 400 creates a circuit graph of the analysis object from the circuit information (step S1902).

Thereafter, the detecting unit 501 detects a node from the circuit graph by topologically scanning the circuit graph (step S1903). It is then determined whether the node is a node to which a plurality of signals is input (step S1904).

When a node to which a plurality of signals is input is detected (step S1904: YES), the estimating unit 502 performs an estimation value calculation to calculate the estimation value of the estimation error of the delay distribution of the node based on the delay distribution of the node group connected to the node in the preceding stage to the node detected by the detecting unit 501 (step S1905).

Subsequently, the determining unit 503 determines whether the calculated estimation value is equal to or larger than the threshold (step S1906). When the estimation value is equal to or larger than the threshold (step S1906: YES), the extracting unit 506 extracts a subtree that includes the node (step S1907).

The designating unit 507 designates the subtree extracted by the extracting unit 506 as a circuit exempt from analysis (1910). On the other hand, when the estimation value is smaller than the threshold (step S1906: NO), the delay calculating unit 505 calculates the delay distribution of the node by the statistical MAX (step S1908).

It is then determined whether a node that has not been detected by the detecting unit 501 is present (step S1911). When a node that has not been detected is present (step S1911: YES), the process returns to step S1903 and a series of processes is repeated.

When a node to which a plurality of signals is input is not detected at step S1904 (step S1904: NO), the delay calculating unit 505 calculates the delay distribution of the node detected at step S1903 by the statistical SUM (step S1909), and the process proceeds to step S1911. When a node that has not been detected is not present (step S1911: NO), the process proceeds to step S2001 shown in FIG. 20.

In the flowchart shown in FIG. 20, an arbitrary circuit exempt from analysis is focused on among all circuits exempt from analysis designated at step S1910 shown in FIG. 19 (step S2001). Thereafter, the extracting unit 506 extracts an arbitrary node from the circuit focused on and exempt from analysis (step S2002).

The determining unit 503 determines whether the node is included in a critical path (step S2003). When the node is included in a critical path (step S2003: YES), the determining unit 503 determines whether the device sensitivity indicating a change rate of parameters concerning the delay distribution of the node is equal to or higher than a threshold (step S2004).

When the device sensitivity is equal to or higher than the threshold (step S2004: YES), the extracting unit 506 extracts a path that passes through the node from the circuit graph (step S2005). The designating unit 507 designates a partial circuit constituted of the extracted path as a partial circuit of a reanalysis object (step S2006).

Thereafter, it is determined whether all the circuits exempt from analysis designated at step S1910 shown in FIG. 19 have been covered (step S2007). When not all the circuits exempt from analysis have been covered (step S2007: NO), the process returns to step S2001 to focus on an arbitrary circuit exempt from analysis among circuits that have not yet been focused on (step S2001). A series of processes are then repeated.

On the other hand, when the node is not included in a critical path (step S2003: NO), or when the device sensitivity is lower than the threshold (step S2004: NO), it is determined whether a node that has not been extracted is present among the circuits focused on and exempt from analysis (step S2008).

When a node that has not been extracted is present (step S2008: YES), the process returns to step S2002 and a series of processes are repeated. On the other hand, when a node that has not been extracted is not present (step S2008: NO), the process proceeds to step S2007.

When all the circuits exempt from analysis have been covered (step S2007: YES), the delay calculating unit 505 conducts the Monte Carlo simulation to calculate the delay distribution of the reanalysis object designated by the designating unit 507 at step S2006 (step S2009).

Finally, the output unit 504 outputs a result of calculation performed by the delay calculating unit 505 (step S2010), and a series of processes in this flowchart is ended.

Thus, the delay distribution of a subtree including a node for which the estimation error of the approximate solution in the statistical MAX or the like is predicted to be large can be automatically calculated by the Monte Carlo simulation.

Figure 21:
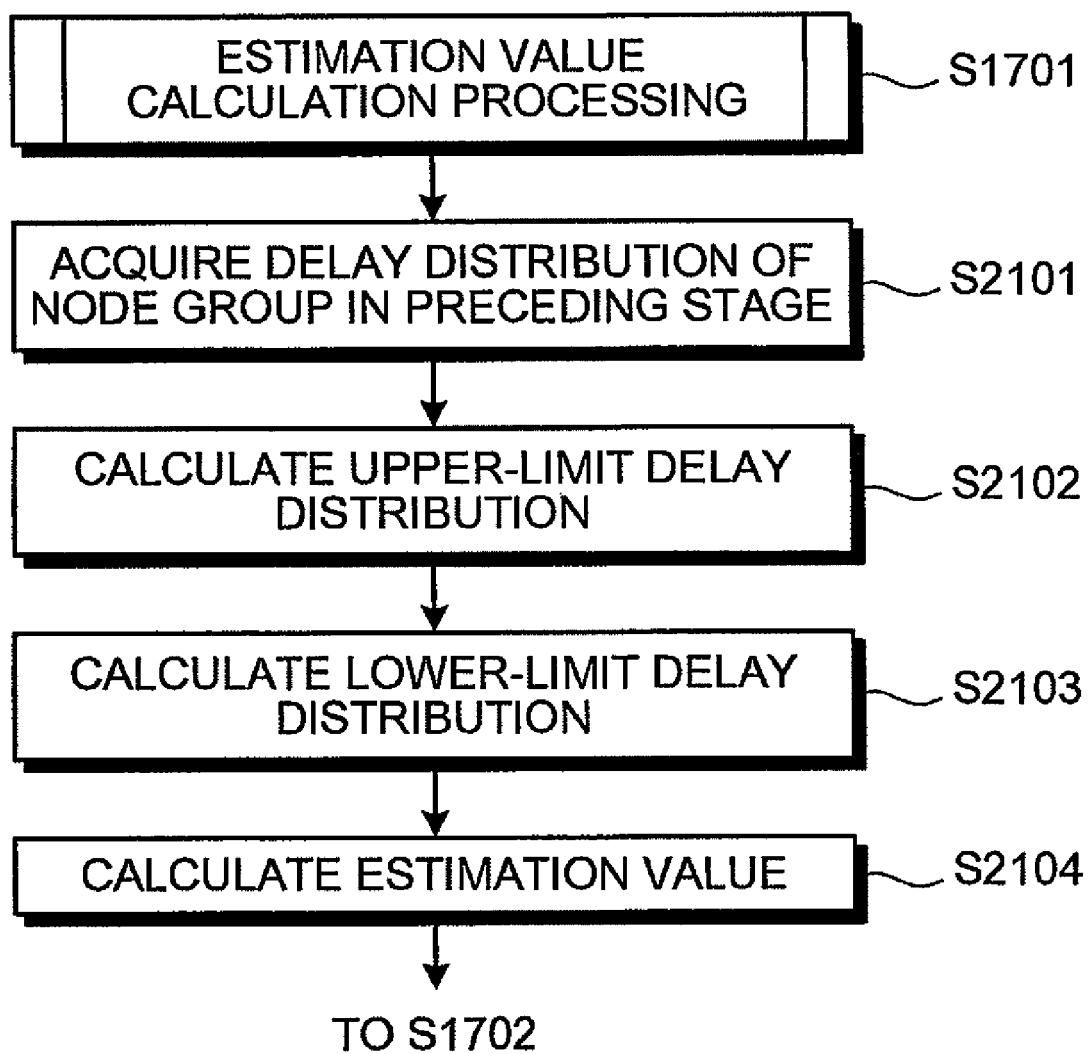
FIG. 21 is a flowchart of an estimation value calculation (I)

FIG. 21 is a flowchart of an estimation value calculation (I). First, the delay distribution of a node group in a preceding stage to the node to which a plurality of signals is input is acquired (step S2101).

Based on the delay distribution of the node group in the preceding stage, the upper-limit delay distribution statistically expressing upper limit values of the delay of the node group is calculated (S2102). Furthermore, based on the delay distribution of the node group in the preceding stage, a lower-limit delay distribution statistically expressing lower limit values of the delay of the node group is calculated (S2103).

The mean value and the standard deviation of the upper-limit delay distribution and the standard deviation and the mean value of the lower-limit delay distribution are substituted to Equation 4 or Equation 5 above to calculate the estimation value of the estimation error of the delay distribution of the node (step S2104), and the process proceeds to step S1702 shown in FIG. 17.

FIG. 22 is flowchart of the estimation value calculation (II). In this example, the delay distribution of a node $N_i$ (i=1, 2, ..., t) in the preceding stage to the node to which a plurality of signals is input is Pi, a mean value thereof is mi, and a standard deviation is σi. α is an integer that can be arbitrarily determined (e.g. α=2.5, 3.0, or the like).

Among the delay distribution $P_i$ of the node $N_i$ (i=1, 2, ..., K) in the preceding stage, a delay distribution whose mean value mi is the largest is Pmax, and the standard deviation thereof is σmax. In addition, the estimation value is eN, and an initial value is "eN=0".

As shown in FIG. 22, first the delay distribution Pi of a node in the preceding stage to the node to which a plurality of signals is input is acquired (step S2201). Suppose i=1 (step S2202), it is determined whether Pi=Pmax (step S2203). When it is not Pi=Pmax (step S2203: NO), it is determined whether $(mi+3\sigma i)>(mmax-\alpha\sigma_{max})$ (step S2204).

When it is $(m_i+3\sigma i)>(mmax-\alpha\sigma max)$ (step S2204: YES), eN=eN+1 (step S2205). i is incremented (step S2206), and it is determined whether i>K (step S2207). When it is not i>K (step S2207: NO), the process returns to step S2203 and a series of processes are repeated. On the other hand, when i>K (step S2207: YES), the process proceeds to step S1702 shown in FIG. 17.

When Pi=Pmax (step S2203: YES), the process proceeds to step S2206. Further, when it is not $(m_i+3\sigma i)>(m_{max}-\alpha\sigma_{max})$ (step S2204: NO), the process proceeds to step S2206.

As described above, it is possible to calculate, automatically and accurately, the delay distribution of a partial circuit constituted of a path passing through a node for which the estimation error in the approximate calculation of the delay distribution of a node at which multiple signals run together is predicted to be large.

Moreover, among nodes for which the estimation error is predicted to be large, a partial circuit that is constituted of a path passing through a node that is present on a critical path having large influence on the circuit delay and that has high possibility that the circuit delay is improved is to be an analysis object by the Monte Carlo simulation, thereby reducing a scale of analysis object circuit and speeding up the delay analysis.

Furthermore, by accurately estimating the circuit delay, an unnecessary delay margin can be effectively eliminated. As a result, it is possible to reduce a chip area in an analysis object circuit, and to reduce work load for timing correction.

As above, according to the present embodiment, by performing high speed and highly accurate delay analysis, it is possible to reduce load on a designer and to reduce a design period.

The delay analysis supporting method explained in the present embodiment can be implemented using a computer such as a personal computer and a work station, to execute a program that is prepared in advance. This program is recorded on a computer-readable recording medium such as a hard disk, a flexible disk, a CD-ROM, an MO, and a DVD, and is executed by a computer reading from the recording medium. Moreover, this program can be a transmission medium that can be distributed through a network such as the Internet.

The delay analysis supporting apparatus 400 can be implemented also by a standard cell, an application specific integrate circuit (ASIC) such as a structured ASIC, or a programmable logic device (PLD) such as a field programmable gate array (FPGA). Specifically, the functions 501 to 508 of the delay analysis supporting apparatus 400 are defined by HDL description, and the HDL description is logically synthesized to be given to ASIC or PLD. Thus the delay analysis supporting apparatus 400 can be manufactured.

According to the delay analysis supporting program, the recording medium that stores the delay analysis supporting program, the delay analysis supporting apparatus, and the delay analysis supporting method according to the embodiments described above, by performing high speed and highly accurate delay analysis, it is possible to reduce load on a designer and to reduce a design period.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A non-transitory computer-readable recording medium that stores therein a computer program for supporting delay analysis to estimate a delay distribution of a circuit graph of an analysis object by a block-based analysis, the computer program causing a computer to execute:
   detecting, from the circuit graph, a node to which a plurality of signals is input;
   estimating an estimation value concerning an estimation error of a delay analysis of the node, based on a delay distribution of a node group in a preceding stage to the node detected at the detecting;
   determining whether the estimation value is equal to or larger than a threshold;
   outputting a result of determination made at the determining;
   calculating a delay distribution of a path that passes through the node by conducting a Monte Carlo simulation when the estimation value is determined to be equal to or larger than the threshold at the determining; and
   outputting a result of calculation at the calculating.

2. The computer-readable recording medium according to claim 1, the estimating includes estimating the estimation value using an upper-limit delay distribution indicating variation of upper limit values of a delay of the node group and a lower-limit delay distribution indicating variation of lower limit values of a delay of the node group.

3. The computer-readable recording medium according to claim 1, wherein
   the computer program further causes the computer to execute determining whether the node is included in a critical path, and
   the calculating includes calculating the delay distribution of the path by conducting the Monte Carlo simulation when the node is determined to be included in a critical path.

4. The computer-readable recording medium according to claim 1, wherein
   the computer program further causes the computer to execute determining whether a device sensitivity indicating a change rate of parameters concerning the delay distribution of the node is equal to or higher than a threshold, and
   the calculating includes calculating the delay distribution of the path by conducting the Monte Carlo simulation when the device sensitivity is determined to be equal to or higher than the threshold.

5. The computer-readable recording medium according to claim 1, wherein the computer program further causes the computer to execute calculating a delay distribution of a subtree including the node by conducting the Monte Carlo simulation when the estimation value is determined to be equal to or larger than the threshold.

6. The computer-readable recording medium according to claim 5, wherein
   the computer program further causes the computer to execute determining whether the node is included in a critical path, and
   the calculating includes calculating the delay distribution of the subtree by conducting the Monte Carlo simulation when the node is determined to be included in a critical path.

7. The computer-readable recording medium according to claim 5, wherein
   the computer program further causes the computer to execute determining whether a device sensitivity indicating a change rate of parameters concerning the delay distribution of the node is equal to or higher than a threshold, and
   the calculating includes calculating the delay distribution of the subtree by conducting the Monte Carlo simulation when the device sensitivity is determined to be equal to or higher than the threshold.

8. A non-transitory computer-readable recording medium that stores therein a computer program for supporting delay analysis to estimate a delay distribution of a circuit graph of an analysis object by a block-based analysis, the computer program causing a computer to execute:
   detecting, from the circuit graph, a node to which a plurality of signals is input;
   estimating an estimation value concerning an estimation error of a delay analysis of the node, based on a delay distribution of a node group in a preceding stage to the node detected at the detecting;
   determining whether the estimation value is equal to or larger than a threshold;
   outputting a result of determination made at the determining;
   switching the delay analysis from the block-based analysis to a Monte Carlo simulation when the estimation value is determined to be equal to or larger than the threshold at the determining;

calculating a delay distribution of a subtree that includes the node by conducting the Monte Carlo simulation using the delay distribution of the node group obtained by the block based analysis when the delay analysis is switched to the Monte Carlo simulation; and outputting a result of calculation at the calculating.

9. The computer-readable recording medium according to claim 8, wherein the computer program further causes the computer to execute calculating a delay distribution of the node by conducting the Monte Carlo simulation using the delay distribution of the node group when the delay analysis is switched to the Monte Carlo simulation.

10. The computer-readable recording medium according to claim 9, wherein the computer program further causes the computer to execute:

switching the delay analysis from the Monte Carlo simulation to the block based analysis when the delay distribution of the node is calculated; and calculating a delay distribution of a node in a subsequent stage to the node by conducting the block based analysis using the delay distribution of the node when the delay analysis is switched back to the block based analysis.

11. A delay analysis supporting apparatus that supports delay analysis to estimate a delay distribution of a circuit graph of an analysis object by a block-based analysis, the delay analysis supporting apparatus comprising:

a detecting unit that detects, from the circuit graph, a node to which a plurality of signals is input;

an estimating unit that estimates an estimation value concerning an estimation error of a delay analysis of the node, based on a delay distribution of a node group in a preceding stage to the node detected by the detecting unit;

a determining unit that determines whether the estimation value is equal to or larger than a threshold;

a calculating unit that calculates a delay distribution of a path that passes through the node by conducting a Monte Carlo simulation when the estimation value is determined to be equal to or larger than the threshold at the determining; and an outputting unit that outputs a result of calculation at the calculating.

12. A delay analysis supporting method for supporting delay analysis to estimate a delay distribution of a circuit graph of an analysis object by a block-based analysis, the delay analysis supporting method comprising:

detecting, using a computer, from the circuit graph, a node to which a plurality of signals is input;

estimating an estimation value concerning an estimation error of a delay analysis of the node, based on a delay distribution of a node group in a preceding stage to the node detected at the detecting;

determining whether the estimation value is equal to or larger than a threshold;

outputting a result of determination made at the determining;

calculating a delay distribution of a path that passes through the node by conducting a Monte Carlo simulation when the estimation value is determined to be equal to or larger than the threshold at the determining; and outputting a result of calculation at the calculating.

* * * * *